US008238113B2

(12) United States Patent
Iihola et al.

(10) Patent No.: US 8,238,113 B2
(45) Date of Patent: Aug. 7, 2012

(54) ELECTRONIC MODULE WITH VERTICAL CONNECTOR BETWEEN CONDUCTOR PATTERNS

(75) Inventors: Antti Iihola, Helsinki (FI); Petteri Palm, Helsinki (FI)

(73) Assignee: Imbera Electronics Oy, Espoo (FI)

( * ) Notice: Subject to any disclaimer, the term of this patent is extended or adjusted under 35 U.S.C. 154(b) by 203 days.

(21) Appl. No.: 12/842,052

(22) Filed: Jul. 23, 2010

(65) Prior Publication Data
US 2012/0020044 A1    Jan. 26, 2012

(51) Int. Cl.
*H05K 1/18* (2006.01)
*H05K 7/00* (2006.01)

(52) U.S. Cl. ........ 361/761; 361/762; 361/764; 361/783; 257/723

(58) Field of Classification Search .................. None
See application file for complete search history.

(56) References Cited

U.S. PATENT DOCUMENTS

| | | | | |
|---|---|---|---|---|
| 5,432,677 A * | 7/1995 | Mowatt et al. | ................ | 361/719 |
| 6,359,235 B1 * | 3/2002 | Hayashi | ........................ | 174/260 |
| 7,321,164 B2 * | 1/2008 | Hsu | ................................ | 257/686 |
| 7,485,489 B2 * | 2/2009 | Bjorbell | ........................ | 438/106 |
| 7,544,537 B2 * | 6/2009 | Kawabata et al. | ............ | 438/106 |
| 7,548,432 B2 * | 6/2009 | Lu et al. | ........................ | 361/763 |
| 7,588,951 B2 * | 9/2009 | Mangrum et al. | .............. | 438/25 |
| 7,608,477 B2 * | 10/2009 | Ikeda | ............................. | 438/106 |
| 7,613,007 B2 * | 11/2009 | Amey et al. | ..................... | 361/763 |
| 7,807,512 B2 * | 10/2010 | Lee et al. | ..................... | 438/127 |
| 7,906,370 B2 * | 3/2011 | Morita | ......................... | 438/106 |

* cited by examiner

*Primary Examiner* — Boris Chervinsky
(74) *Attorney, Agent, or Firm* — Seppo Laine Oy; Joshua P. Wert

(57) ABSTRACT

The present invention generally relates to a new structure to be used with electronic modules such as printed circuit boards and semiconductor package substrates. Furthermore there are presented herein methods for manufacturing the same. According to an aspect of the invention, the aspect ratio of through holes is significantly improved. Aspect ratio measures a relationship of a through hole or a micro via conductor in the direction of height divided width. According to the aspect of the invention, the aspect ratio can be increased over that of the prior art solution by a factor of ten or more.

21 Claims, 20 Drawing Sheets

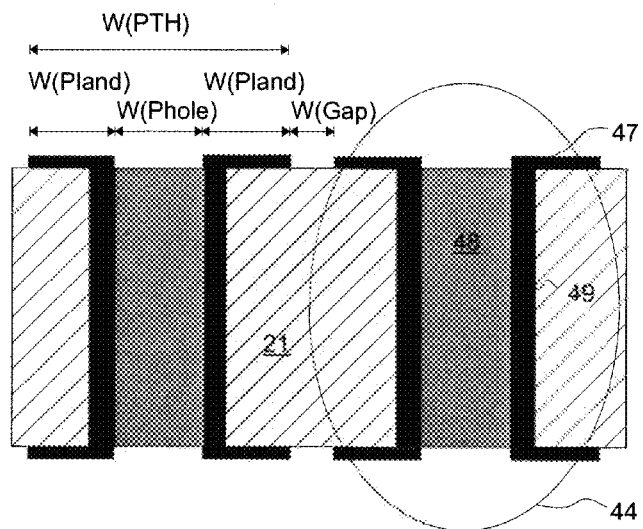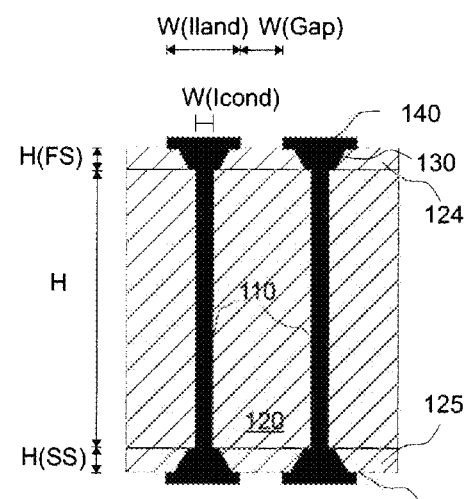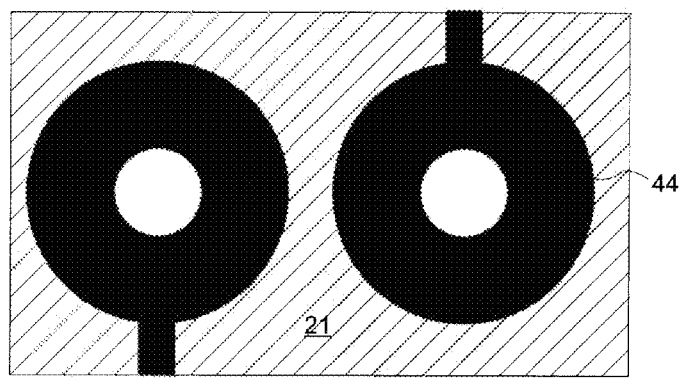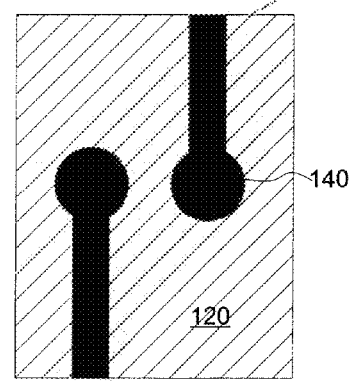
Fig. 3A (prior art)　　　　Fig. 3B

ELECTRONIC MODULE WITH VERTICAL CONNECTOR BETWEEN CONDUCTOR PATTERNS

TECHNICAL FIELD

The present invention relates to electronic modules and structural parts thereof.

In particular, the present invention relates to electronic modules that comprise at least two conductor pattern layers and at least one semiconductor component at least partly embedded an insulating layer between the conductor pattern layers.

BACKGROUND ART

U.S. Patent Application Publication No. 2004/0155347 A1 (Ho et al.) addresses the problem of vertically routing a conductive rod from the bottom of a substrate, thorough all layers, to the top of the substrate. With the aid of the presented embodiment an increase in routing density can be achieved. Nevertheless, when utilizing this method in microcircuits having for example hundreds of pads, it is inefficient and slow thus increasing manufacturing time and costs.

U.S. Patent Application Publication No. 2002/0135058 A1 (Asahi et al.) discloses a component build-in module with plated through hole solutions. With the aid of the presented embodiment an increase in routing density can be achieved as well as build-up layers need not to be constructed so many or at all. Nevertheless, when utilizing this method in microcircuits having for example hundreds of pads, it is inefficient and slow thus increasing manufacturing time and costs.

Presently, there are many different methods and available technologies to make an electrical connection between two sides of a wiring board with the aid of a penetrated hole, also called a through hole. One early phase method to make a through hole is to use a conductive rivet pin that is assembled into a through hole of an otherwise ready-made wiring board. The rivet pin solution is slow to assemble as well as expensive, unreliable and does not adequately reduce the size of necessary through holes. Other prior art methods are plated through holes (PTH) and via-on-via structures. All of the prior art methods fail to solve the problems presented above.

For example, by using chemical and/or electroplating technologies it is practically impossible to achieve reliable conductive micro vias having aspect ratio (height/width) greater than 1,00 when the diameter of micro vias are 150 μm or less. The same applies in case of through holes where a typical aspect ratio is 8:1 and in maximum 12:1. In other words, the throwing power limits the narrow and deep through holes or micro vias becoming reliably conductive and solid with the conductive material. Throwing power means ability to saturate narrow and deep through holes or micro vias with conductive material by means of chemical or electrolytic growing methods. The situation is also likewise by using any kind of conductive paste or adhesive in micro vias and through holes having a respective aspect ratio greater than mentioned above when the diameter of micro vias and through holes are 150 μm or less.

Thus, the background art contains different solutions that do not adequately provide high routing efficiency with an affordable price of the product. There remains a need to seek further techniques with potentially improved properties in view of routing efficiency and price, in particular when it is aimed to increase the number of contacts of the components and narrow the pitch between the contact lands, or bumps, on the component.

SUMMARY OF INVENTION

According to an aspect of the invention, the electronic module comprises at least one conductive trace structure inside the dielectric substrate of the module, the conductive trace structure comprising at least one conductive trace electrically connected to the wiring layers at opposite sides of the dielectric substrate.

According to another aspect of the invention, the conductive trace structure further comprises a piece of dielectric that supports said at least one conductive trace.

According to an embodiment, the piece of dielectric that supports the conductive trace has a different orientation than the dielectric substrate of the module.

According to an embodiment, the piece of dielectric that supports the conductive trace is of different material than the dielectric substrate of the module.

According to an embodiment, the piece of dielectric includes fiber reinforcement having a generally vertical orientation and the dielectric substrate of the module has a generally horizontal orientation.

According to an embodiment, the piece of dielectric that supports the conductive trace is of different material than the dielectric substrate of the module.

The present invention generally relates to a new structure to be used with electronic modules such as printed circuit boards and semiconductor package substrates. Furthermore there are presented herein methods for manufacturing the same.

According to an aspect of the invention, the aspect ratio of through holes is significantly improved. Aspect ratio measures a relationship of a through hole or a micro via conductor in the direction of height divided width. Typically the aspect ratio (height/width) for micro vias is 0.75 to 1.00 for through holes 8:1 to 12:1 in prior art solutions. According to the aspect of the invention, the aspect ratio can be increased over that of the prior art solution by a factor of ten or more.

According to another aspect of the invention, there is no need to scale through holes and micro vias when the thickness of a substrate changes.

According to a further aspect of the invention, the new structure increases routing and through hole density as well as reducing XY area (i.e. footprint) and the size (i.e. diameter) of through holes of an electronic module.

According to another aspect of the invention, the new structure includes a dense and parallel conductive trace structure. The conductive trace structure preferably being positioned such that the conductive channels from a component to the conductive trace structure are substantially in a vertical direction in relation to a planar dielectric base substrate, i.e. a printed circuit board or semiconductor package. Furthermore, it is preferable that the conductive trace structure is at least partly inside the planar dielectric base substrate. The dense and parallel conductive trace structure makes possible significantly longer conductive interconnection connections in the vertical direction than any known technology used in the field of printed circuit boards.

More over the conductive trace structure offers more reliable connections and it quickens the assembly process of a semiconductor component inside a printed circuit board or a base substrate.

According to an aspect of the invention, the conductive trace structure can be pre-fabricated and then it can be assembled easily into a base substrate by means of pick and place.

According to another aspect of the invention, the conductive trace structure can be totally embedded inside the planar dielectric base substrate of an electronic module.

In particular, an aspect of the present invention generally relates to introducing a pre-fabricated element with conductive traces and embedding the element at least partly inside a base substrate so that the conductive traces of the element comprise substantially conductive interconnection between an embedded semiconductor component and at least one conductive layer of a base substrate. Furthermore, there is presented a manufacturing method of a printed circuit board having an embedded conductive trace structure and connecting the at least partly embedded conductive trace structure between a semiconductor component and conductive layer. Introducing such novel prefabricated elements and utilizing embedding placing methods and technology an efficient, reliable and cost-effective high density connection between conductive surfaces of the base substrate is achieved. All the electronic connections between a conductive trace structure, different wiring layers and a component are made solderlessly and metallurgically.

According to a further aspect of the present invention, all the connections and wiring layers are preferably made from one conductive material, metal or metal alloy offering more reliable connections and cost efficiency for manufacture.

It is advantageous in design and operation to bring through holes and micro vias closer to each other. With aid of embodiments of the present arrangement, the needed space for through holes and micro vias can be made much smaller than in prior solutions. Another useful application is routing or redistributing of conductors when a microprocessor or similar multi-pad (typically tens or hundreds of contact pads) component is placed in a small space. In case of routing or redistribution the conductors can also be in other directions than vertical, namely diagonal or horizontal. Thus in this case the density of conductors is naturally smaller than in case where all the conductors are vertically set.

Considerable advantages are gained with the aid of the invention. These because it is possible, with the aid of the invention to embed also a high density conductive trace structure with relatively narrow vertical interconnection contacts in a base substrate. Furthermore, this can be made reliably and economically at least in some embodiments.

BRIEF DESCRIPTION OF DRAWINGS

For a more complete understanding of the present invention and the advantages thereof, the invention is now described with the aid of the examples and with reference to the following drawings, in which:

FIG. 3A presents a cross profile and a top view of two plated through holes according to prior art.

FIG. 3B presents a cross profile and a top view of two conductive traces according to an embodiment of the invention. FIGS. 3A and 3B are in the same scale.

MODES FOR CARRYING OUT THE INVENTION

Figure 1:
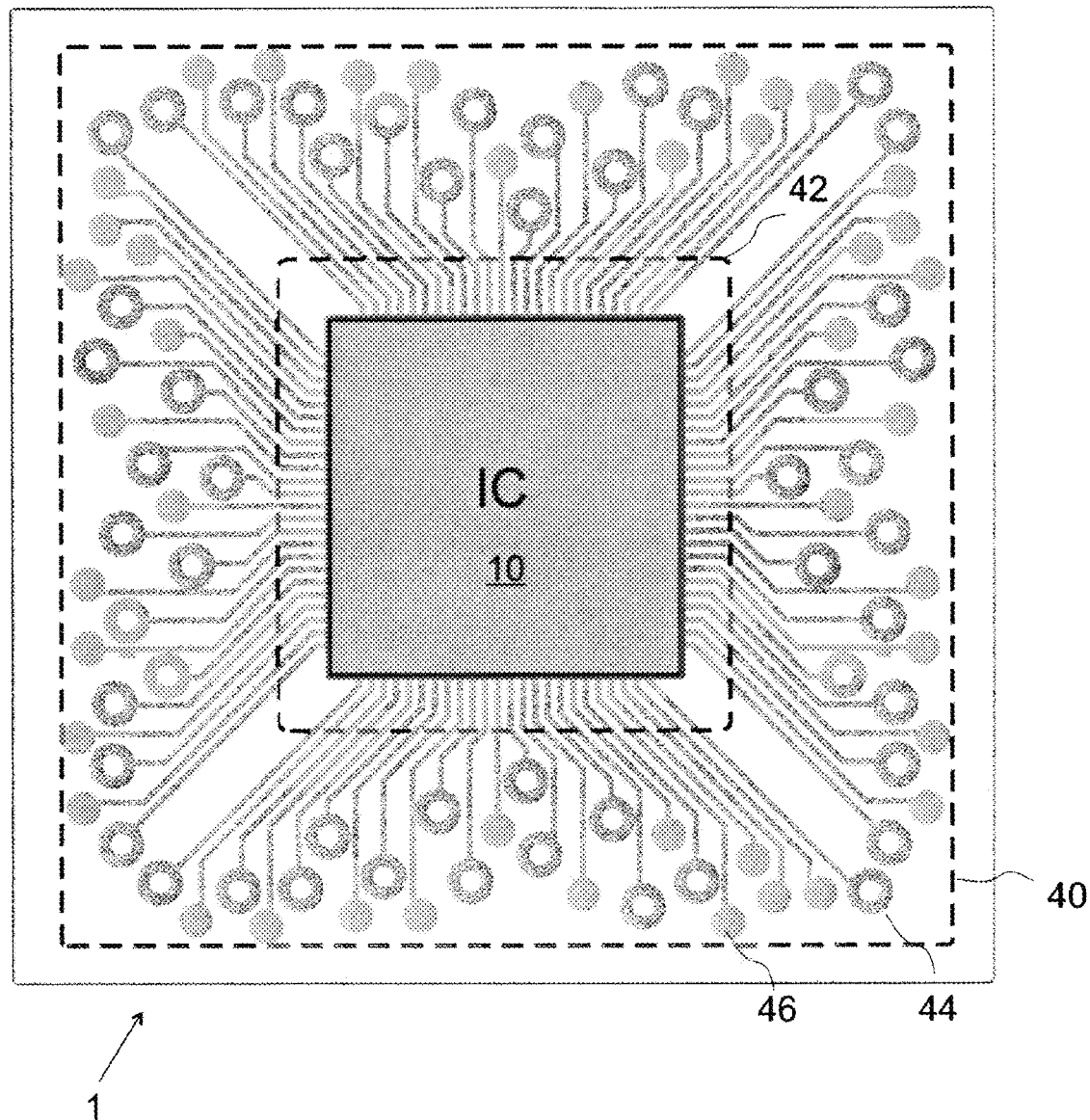
FIG. 1 presents a schematic top view of an electronic module footprint according to prior art.

According to an embodiment of the invention there is a conductive trace structure comprised of both dielectric and conductive layers alternating each other. The conductive trace structure can be, for example, a copper plated bar of a printed circuit board (PCB). The conductive trace structure can be for example a dielectric bar of FR4 or similar material having conductive traces of copper (Cu) on it at least one side of the bar. The conductive trace structure may also be comprised of any other composite material other than FR4 which includes a dielectric layer alternating with conductive layer or a dielectric core and conductive channels on at least one side of the dielectric core.

Moreover, the conductive trace structure may comprise a resistor network or ceramic resistive matrix. The conductors can be circle-shaped and embedded or molded to an insulating material. The conductive trace structure is not limited to a bar, line or rectangular shaped but can be T-shaped, L-shaped, ring-shaped, frame-like, cylinder, semi-cylinder and so on. The conductive trace structure can be placed (embedded) on any location in the base board or substrate. The conductive trace structure does not have to be a fully embedded inside in a base board or substrate but can be partly exposed over the other or both surfaces of the base substrate after embedding and pressing. In this case the extending parts can be removed, for example, by mechanically grinding. Also, the conductive trace structure may have grooves or openings so that the 2D cross section is not necessarily a solid.

In addition, the conductive trace structure can include 1-, 2-, 3-, 4-, or more conductive layers. These conductive layers may be connected with each others, for example, by means of microvias, plated, buried or through holes. Conductive lines of a conductive trace structure do not have to be straight. The conductive lines can be loops, curves or even systems related functional design patterns such as antennas, grounds, EMI shields or like solutions. Furthermore, the conductive lines in different layers may be designed to go different directions (for example, 90 degrees to each other in every other layer). Instead of a bar model, the conductive trace structure can be, for example, a cylinder with layered (wafer-shaped) conductive and dielectric sequential layers.

Further, in multi-layer conductive trace structures the thickness of the dielectric layers may vary. Additionally, the pitch of the conductors at the opposite ends of the conductive trace structure may differ from each other. All of the above aspects give freedom to design a totally new type of electronic modules.

It is not compulsory that conductors are in equal distance with each others on a conductive trace structure. There can be a dense group of conductors locally at the ends of bar-shaped structures or in the corners of frame-like conductive trace structure, for example. Correspondingly, there can be a ground or an EMI shield in a middle of the conductive trace structure in the same example above. Naturally, a dense group of conductors and ground can be located vice versa according to design requirements.

The electronic module may comprise a multi component application where the components are connected to each other with a conductive trace structure wherein the components can be located on top of each other or rear sides together with conductive pads to the same or opposite directions. Also in multilayer applications the conductive trace structure can be placed and connected with any conductive layers. The place (as well as the connections) inside an electronic module may not be symmetrical. Also the conductive trace structure may overtake one or more wiring layers in an electronic module.

A clearly reduced footprint of an electronic module can be achieved by a conductive trace structure according to the present design. By using a printed circuit board bar as a conductive trace structure a line/space of 30/30 can be easily achieved. With this measure it leads to a through hole pitch of 100 micrometers ($\mu$m) and even below. Compared to a normal printed circuit board the through hole pitch is typically 300-400 micrometers ($\mu$m). This means that the footprint area can easily be decreased by at least 25%, even 50%, less than used with prior art solutions such like plated through hole and laser pad means. The reduced footprint advantage is mostly gained with components having tens or even hundreds of contact pads. Moreover, within one assembly of a conductive trace structure there is no need to drill any through holes. Once the conductive trace structure is assembled all the through holes are ready at the same time. Especially in cases where there are hundreds of through holes this increases the speed of the whole assembly process. Moreover, the amount of through holes does not greatly increase the total cost of an electronic module.

Yet another advantage is achieved by designing a conductive trace structure as thick, long and shaped as required, thus extends from upper surface to lower surface without any limitations. With conventional mechanical through holes there is an aspect ratio requirement (typically 8:1, maximum 12:1) to prepare a uniform plating of the holes.

A reduced layer count of an electronic module can be achieved by a conductive trace structure. Because of high density connection pitch a reduced number of build-up layers are required or even no build-up layers at all.

A generous improved reliability can be achieved by a conductive trace structure. According to an embodiment of the invention a conductive trace structure of printed circuit board bar with copper (Cu) traces are full and uniform metal and thus very reliable when exposed on thermal cycling or drop testing. As comparison to normal buried through holes filled with epoxy and through holes with air.

The conductive trace structures can be prefabricated as any other electrical components such as microchips, processors, and just about any passive or active components. Due to this prefabrication, savings in manufacturing cost can easily be recognized. Also, just like other electrical components, all conductive trace structures can be inspected before assembling and embedding them. This gives additional cost savings through improved yield.

A semiconductor package can include one or more semiconductor chips in an electric module utilizing the conductive trace structures of the present invention. The invention is not limited to be used in context with embedded component but can be actually utilized with "conventional" printed circuit boards and substrates where IC's, discrete and all other component are assembled in conventional methods such as surface mount technology (SMT) for example.

FIG. 1 presents a schematic top view of an electronic module according to prior art. The electronic module 1 contains an IC component 10 having ninety-six contact pads. The contact pads need a footprint area 40 for further connection which is implemented by plated through holes (PTH) 44 or laser pads 46. According to minimum line space, plated through hole and laser pad design rules there is also a restricted area 42 into which any through holes or laser pads are not allowed to be placed. There are several reasons why plated through holes and laser pads are not allowed. One reason is that when an electronic module is manufactured, the component needs a certain extra space for alignment and tolerance. That space is typically, for example, ±25 μm. Another reason is that making a conductor (through hole) through a prefilled cavity of resin has likely some challenges, and the connections through the resin are not reliable enough to be places close to the IC. Yet another reason is escape routing, in other words lacking of space in the case of small and/or dense components having tens or even hundreds of pads. Normally in a case of hundreds of pads within a component, the escape routing requires so much space that all PTHs and laser pads do not fit in near the component.

Figure 2:
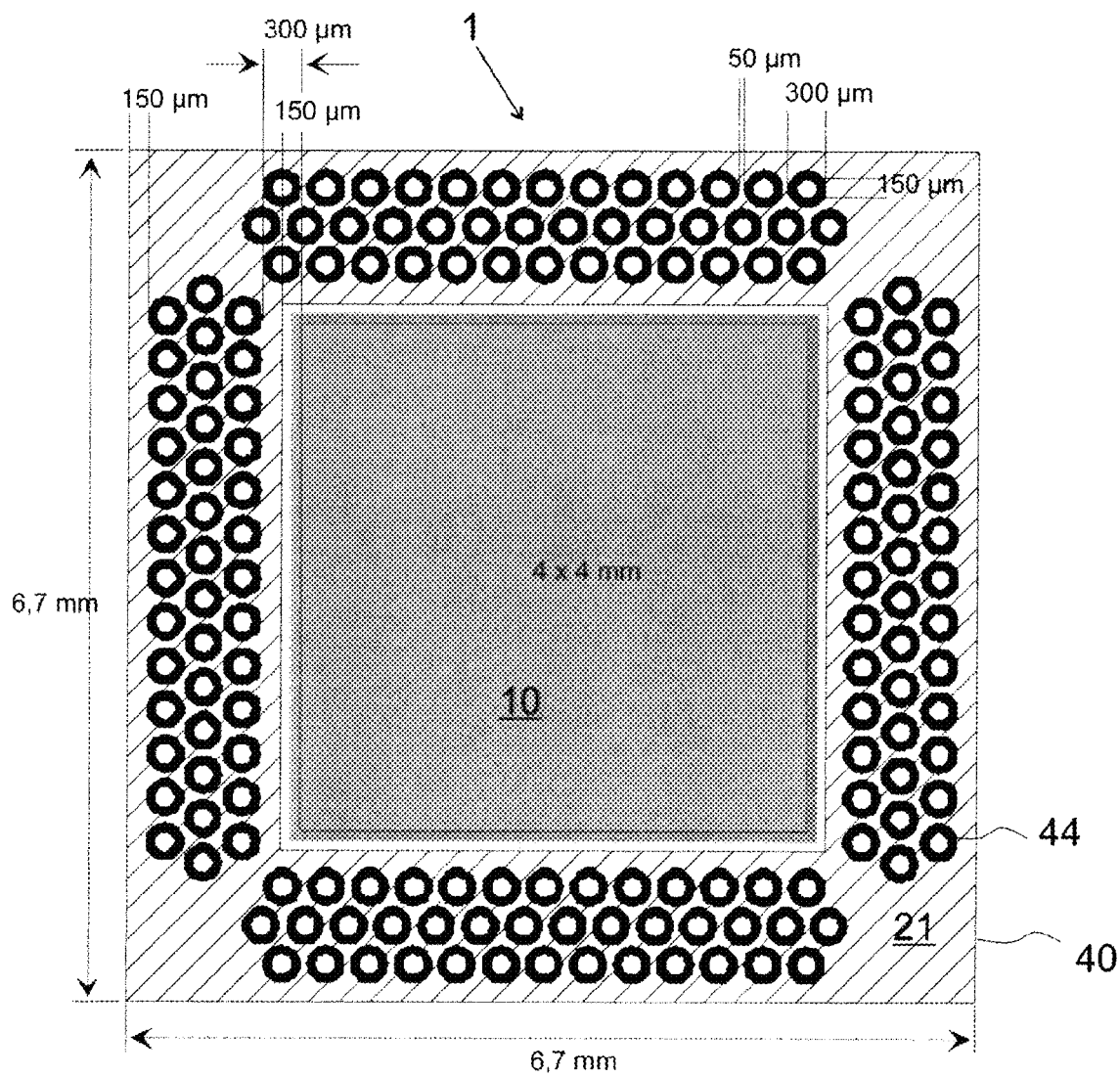
FIG. 2 presents another schematic top views of an electronic module footprint according to prior art.

FIG. 2 presents a schematic top view of an electronic module according to the prior art. A component 10 needs 4 mm×4 mm space. The component 10 has one hundred and sixty contact pads that are directed via plated through holes 44. The plated through holes 44 are in a substrate 21 (e.g. FR4, PI or similar dielectric material). One plated through hole 44 needs typically 300 μm space for landing and the diameter of the actual hole of a plated through hole 44 is typically 150 μm. The plated through holes 44 need typically 50 μm free space to next through hole. The through holes are at every side (four) of the component 10 in three rows. The inner and outer rows have thirteen PTHs and the middle rows have fourteen PTHs each. The total footprint area 40 with typical plated through holes design rules in this example is 6.7 mm×6.7 mm.

FIG. 3A presents a cross profile (above) and a top view (below) of a plated through hole according to prior art. Plated through hole 44 is drilled or punched through a substrate 21 and after that grown chemically and/or electrochemically by conductive material 49. From a top view sight a plated through hole 44 is typically a circle having the hole shaft 48 of diameter W(Phole), for example 150 μm, and a land 47 surrounding the hole shaft 48 W(Pland), typically for example 75 μm. Typical total width dimension W(PTH) of a plated through hole 44 is 300 μm. Then there is also a necessary gap W(Gap) between adjacent lands 47 which is both examples (in FIGS. 3A and 3B) the same, 50 μm. The pitch Pitch(PTH) in this example is 350 μm. The significant issue in plated through holes is the height of the PTH 44 in diameter dimensions of 150 μm and less. The aspect ratio (height/width) for a usable PTH 44 is typically 8:1 and in maximum 12:1. The plating of the hole shaft 48 becomes impossible due to limits of throwing power in diameter dimensions of 150 μm and less.

FIG. 3B presents a cross profile (above) and a top view (below) of a vertical connector according to an embodiment of the invention. The present invention solves the problem of obtaining a smaller pitch than current PTHs, higher and thinner vertical conductors as well as reliable structure. The vertical connectors 110 are supported or surrounded by an insulating material 120. The connectors 110 can be, for example, bars of conductive material, e.g. copper. The insulating material can be, for example, any dielectric substrate such as FR4, PI or similar. It should be noted that the connectors 110 and the insulating material 120 can be prefabricated as a component 100, a conductive trace structure. With aid of the conductive trace structure 100 the vertical conductors 110 can be made closer to each other as well as the distance and diameter can be decreased significantly. The conductive trace structure 100 has on the both ends a small rising which is shown as the height on first surface H(FS) and the height on second surface marked as H(SS). These are also marked in the figures with respective reference numbers 124 and 125.

In FIG. 3B, an example of the dimensions achievable are as follows; the width of a land 140 W(Iland) is 80 μm, the width of a conductor 110 is 30 μm and the gap between lands W(Gap) is the above mentioned 50 μm. It should be noted that the gap can be smaller, 30 μm, for example. The pitch Pitch (Inv) in this example is 130 μm. It should be noted that the pitch in landless applications can be decreased even smaller than that and practically as close as the vertical conductors can be manufactured into/onto a conductive trace structure 100. According to present standard and depending on used materials and methods the pitch can be easily reached at 50 μm, even less. The connection of the conductors 110 can be done by microvias 130 and lands 140 on top of them. It should be noted that the FIGS. 3A and 3B are in same scale.

Figure 4A:
FIG. 4A presents a side view of a first conductive trace structure according to an embodiment of the invention.

FIG. 4A presents a side profile of a board comprising a conductive trace structures. The conductive trace structure 100 contains vertical conductive bars 110 side by side. The height H of the conductive structure 100 is preferably more than the width Wc of one conductor 110.

Figure 4B:
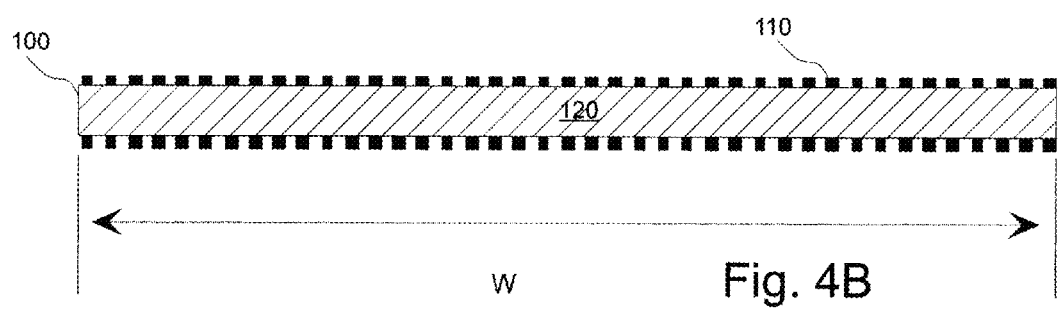
FIG. 4B presents a top view of the first conductive trace structure according to an embodiment of the invention.

FIG. 4B presents a top profile of the embodiment according to the invention presented in FIG. 4A. The conductive trace structure 100 contains on both long sides the vertical conductive bars 110 side by side. In the middle is a dielectric structure 120 which supports the conductors 110. The amount of conductors 110 and gaps between them determines the total width W of the conductive trace structure 100.

Figure 4C:
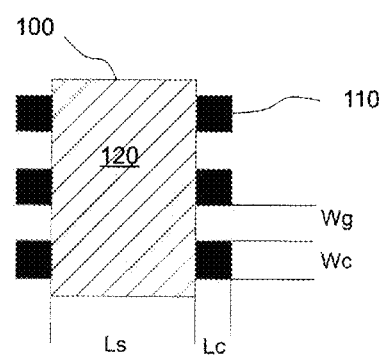
FIG. 4C presents a top view of a part of the first conductive trace structure according to an embodiment of the invention.

FIG. 4C presents a top profile of part of the conductive structure 100 presented in FIG. 4B. In this example the length Ls of the dielectric structure 120 is 200 μm but it can also be greater or smaller. Pick and place machines can reliably handle components of size 500 μm×500 μm. The length Lc and width Wc of the conductors is 50 μm but these can be also greater or smaller. The cross profile of the conductors 110 become square in this example. The length Lc and width Wc do not have to be the same which makes it possible to manufacture the conductors 110 as rectangular form. The gap, Wg between two separate conductors 110 can be the same as the width Wc of the conductors 110. Needless to say that the distance Wg of two separate conductors 110 can also be greater or smaller than the width Wc of the conductors 110. All of the dimensions can be chosen as based off of design requirements.

Figure 4D:
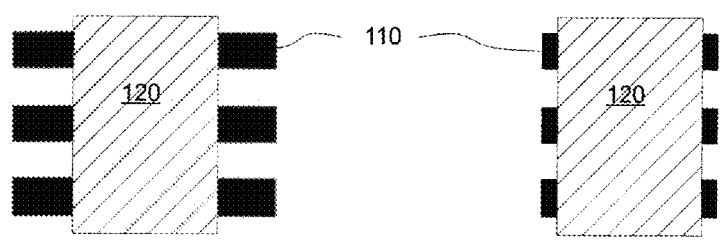
FIG. 4D presents a top view of a part of the first conductive trace structure according to an embodiment of the invention.

FIG. 4D presents a top profile of a part of the conductive structure 100 presented in FIG. 4B. The length Lc of the conductors 110 is bigger than the width Wc of the conductors 110. In some applications this kind of arrangement makes it possible to get even more reliable connections between the conductive trace structure and wiring layers of an embodiment of the invention.

Figure 4E:
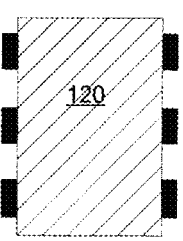
FIG. 4E presents a top view of a part of the first conductive trace structure according to an embodiment of the invention.

FIG. 4E presents a top profile of a part of the conductive structure 100 presented in FIG. 4B. The length Lc of the conductors 110 is shorter than the width Wc of the conductors 110. This kind of arrangement is suitable for when there is lack of space inside an electronic module.

Figures 5A, 5B:
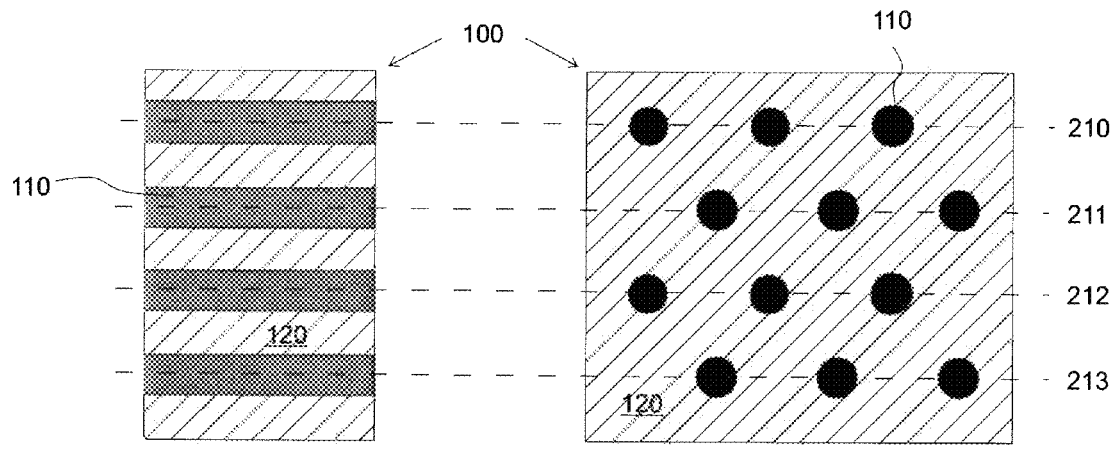
FIG. 5A presents a cross profile of a second conductive trace structure according to an embodiment of the invention.
FIG. 5B presents a top view of the second conductive trace structure according to an embodiment of the invention.

FIGS. 5A and 5B present respectively a cross profile and a top profile of a conductive trace structure. The conductive trace structure 100 contains conductors 110 in four different rows 210-213. The conductors 110 are totally surrounded by an insulation material 120, e.g. by molding the conductors 110 with a dielectric material 120. This kind of structure is useful for instance in electronic modules that contain at least one component (processor, memory chip or similar) having at least tens or even hundreds of contact pads.

Figure 6A:
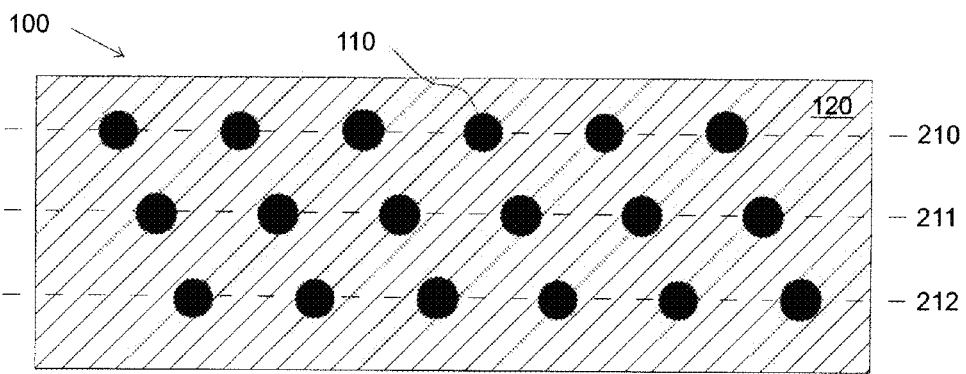
FIG. 6A presents a top view of a third conductive trace structure according to an embodiment of the invention.

FIG. 6A presents a top profile of another conductive trace structure. In this structure there are conductors 110 in three different rows 210-212 comprising a conductive trace structure 100.

Figure 6B:
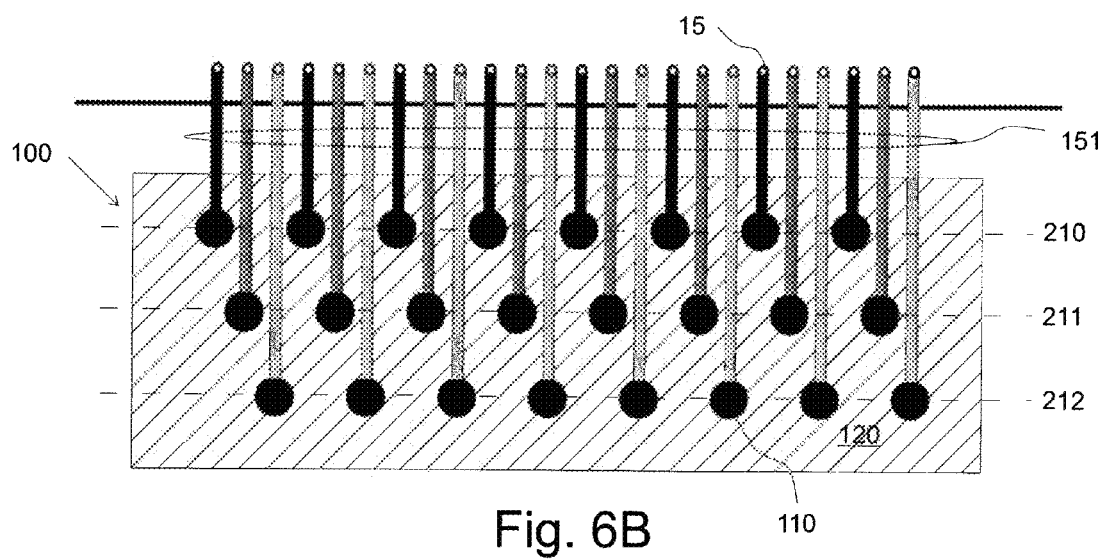
FIG. 6B presents another top view of the third conductive trace structure according to an embodiment of the invention.

FIG. 6B presents a top profile of a similar conductive trace structure to FIG. 6A on the side of a first wiring layer (i.e. active side of a component 10). The first wiring layer conductors 151 are connected to the component's 10 contact pads 15 by micro vias as well as to the conductive trace structure's 100 conductors 110. This kind of structure is useful for instance in electronic modules that contain at least one component (processor, memory chip or similar) having at least tens or even hundreds of contact pads.

Figure 7:
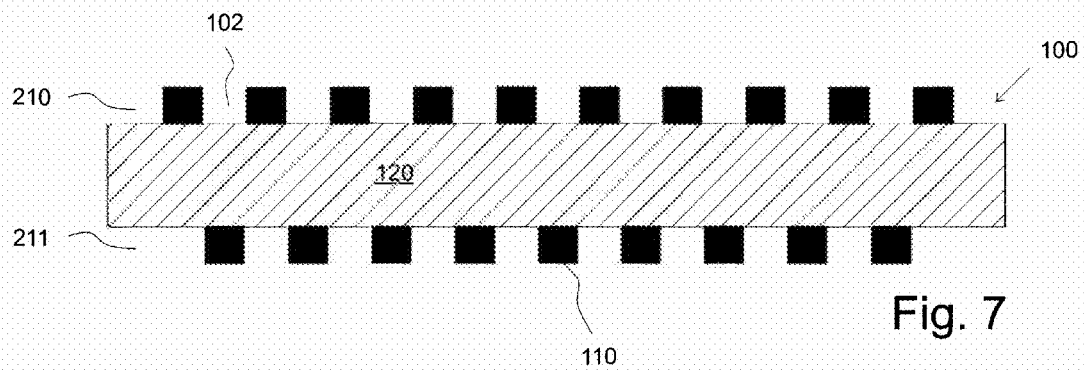
FIG. 7 presents a top view of a fourth conductive trace structure according to an embodiment of the invention.

FIG. 7 presents a top profile of a conductive trace structure. The conductive trace structure 100 contains conductors 110, and gaps between them 102 in two rows 210 and 211. The conductors 110 are positioned such that when there is a conductor 110 in the first row 210 at the corresponding place is a gap 102 in the second row 211 and vice versa. This kind of structure is useful for instance in electronic modules that contain at least one component (processor, memory chip or similar) having at least tens or even hundreds of contact pads.

Figure 8:
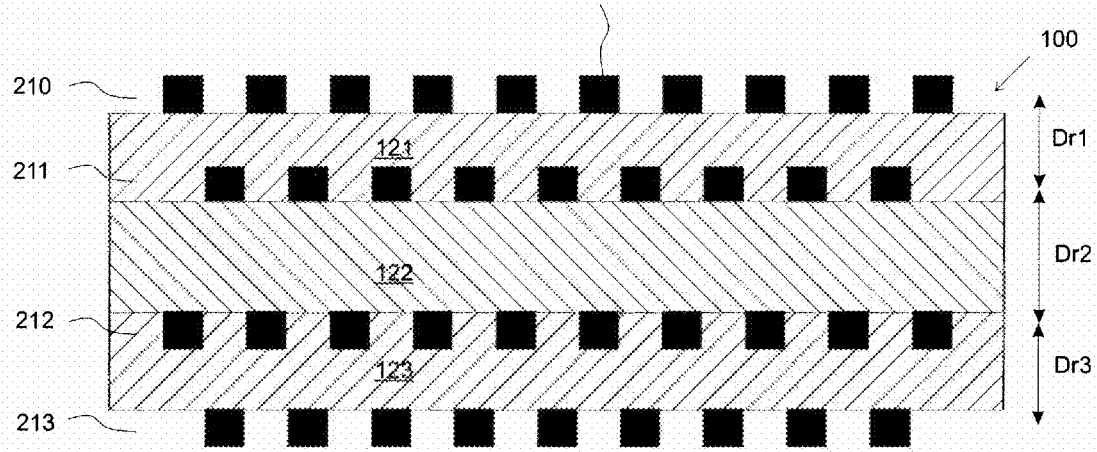
FIG. 8 presents a top view of a fifth conductive trace structure according to an embodiment of the invention.

FIG. 8 presents a top profile of a conductive trace containing conductors 110 in four rows 210, 211, 212 and 213. The conductors 110 are positioned such that when there is a conductor 110 in the first row 210 at the corresponding place is a gap 102 in the second row 211 (likewise in the FIG. 7). The conductors 110 of the third row 212 are positioned at the same place than the conductors 110 in the first row 210. Also the conductive trace structure 100 can comprise three different dielectric layers, namely 121, 122 and 123 in the FIG. 8. Furthermore, it should be noted that the distance of the conductive rows (Dr1: distance between the first and second rows; Dr2: distance between the second and third rows; Dr3: distance between the third and fourth rows) can vary, though it can also be constant. This allows the design of locally more dense vertical connections in an electronic module. This kind of structure is useful for instance in electronic modules that contain at least one component (processor, memory chip or similar) having at least tens or even hundreds of contact pads.

Figure 9:
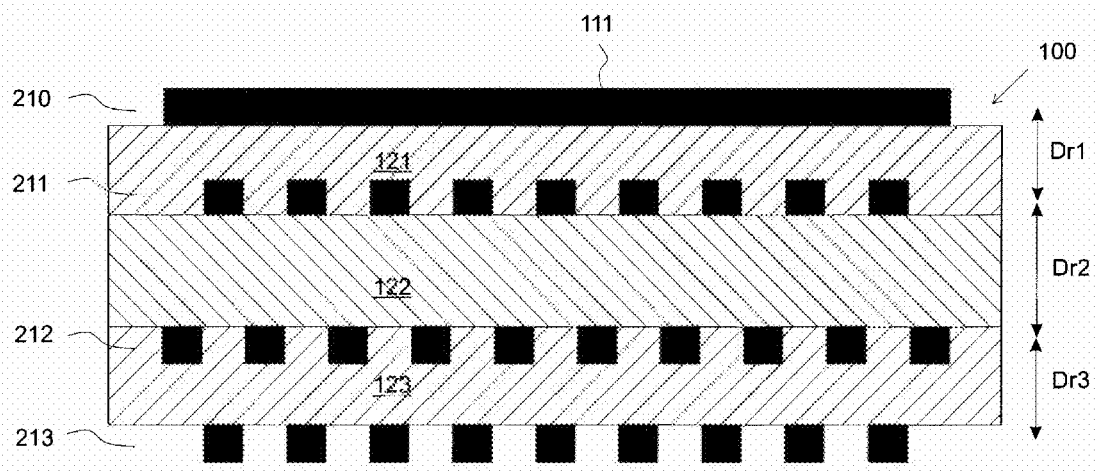
FIG. 9 presents a top view of a sixth conductive trace structure according to an embodiment of the invention.

FIG. 9 presents a top profile of a conductive trace structure containing conductors in four rows 210, 211, 212 and 213. In this example the first row 210 comprises of a functional conductor 111 which can be a ground or an EMI (Electromagnetic Interference) shield. The other conductor rows 211-213 are rows of conductors 110 as in FIG. 8. Further the conductive trace structure 100 may be of three different insulation layers 121-123. As in the previous example, the different insulation layers 121-123 may have their own dimensions. This kind of structure is useful for instance in electronic modules that contain at least one component (processor, memory chip or similar) having at least tens or even hundreds of contact pads. Moreover components that need extra protection for radiation can be protected by this kind of conductive trace structure.

Figure 10:
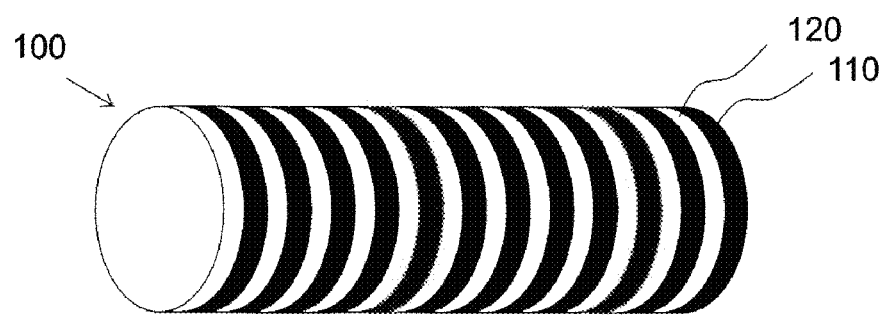
FIG. 10 presents a side view of a seventh conductive trace structure according to an embodiment of the invention.

FIG. 10 presents a schematic view of a conductive trace structure 100 comprised of alternating cylinder shaped parts ("coins") of insulation 120 and conductive 110 materials. This kind of structure can be useful as a connector or adaptor type of applications.

Figure 11:
FIG. 11 presents a side view of an eighth conductive trace structure according to an embodiment of the invention.

FIG. 11 presents a schematic view of a conductive trace structure 100 comprised of alternating semi-cylinder shaped parts ("semi-coins") of insulation 120 and conductive 110 materials. This kind of structure can be useful as connector or adaptor type of applications.

Figure 12:
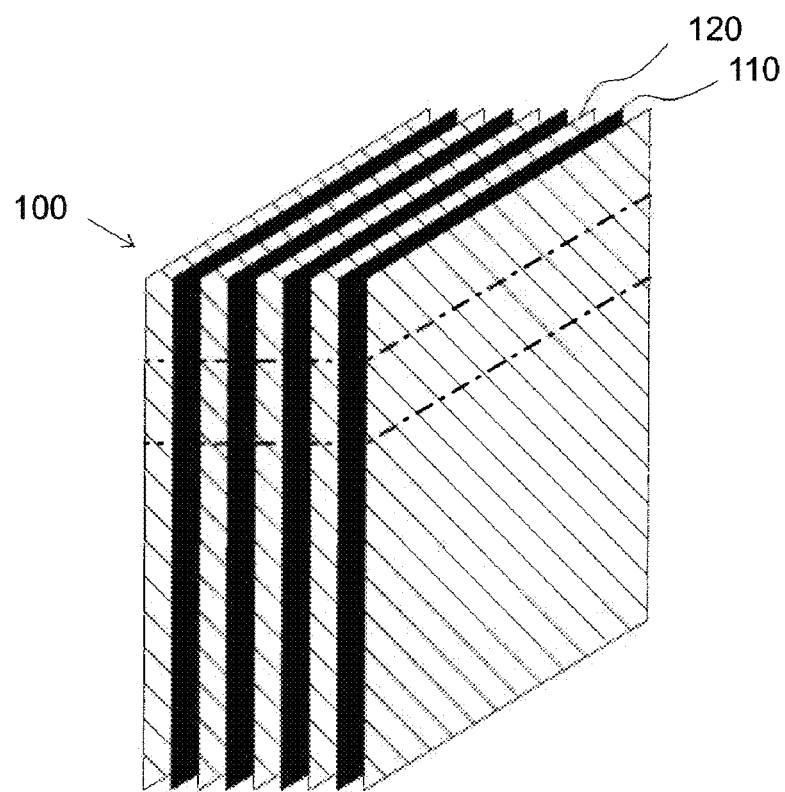
FIG. 12 presents a side view of a ninth conductive trace structure according to an embodiment of the invention.

FIG. 12 presents a schematic view of a conductive trace structure 100 comprised of alternating planar type of parts of insulation 120 and conductive 110 materials.

Figures 13A, 13B:
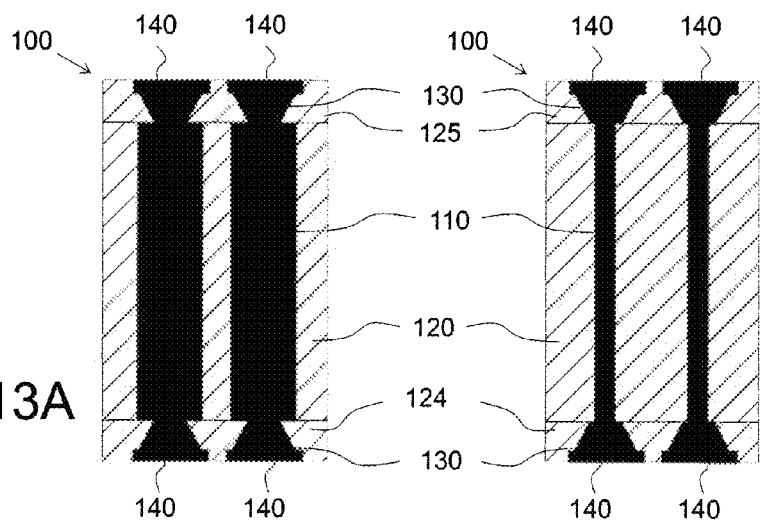
FIG. 13A presents an example of two conductors of a conductive trace structure according to an embodiment of the invention.
FIG. 13B presents another example of two conductors of a conductive trace structure according to an embodiment of the invention.

FIG. 13A presents a cross profile of a conductive trace structure 100 having conductors 110 substantially as thick as the lands 140 on both wiring layers. The connection to the wiring layers is done by micro vias 130.

FIG. 13B presents a cross profile of a conductive trace structure having conductors 110 substantially narrower than the lands 140 on both wiring layers. The connection to the wiring layers is done by micro vias 130.

Figure 13C:
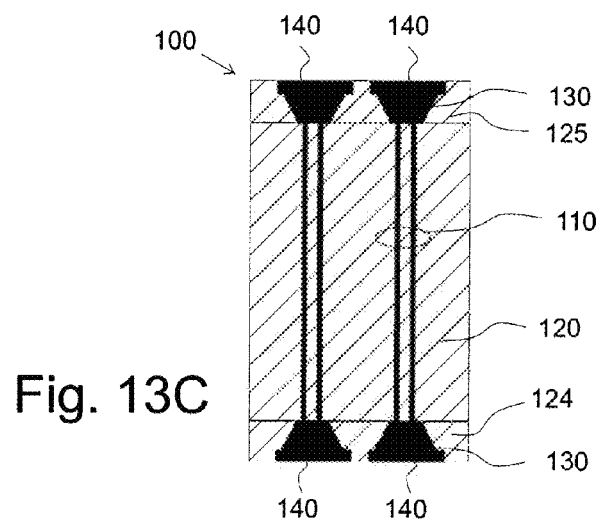
FIG. 13C presents yet another example of two conductors of a conductive trace structure according to an embodiment of the invention.

FIG. 13C presents a cross profile of a conductive trace structure having a conductor 110 comprised of at least two individual conductors inside the insulation material 120.

The connection to the wiring layers is done by micro vias 130. Naturally, there can also be more than two individual conductors to make one conductive trace.

Figure 13D:
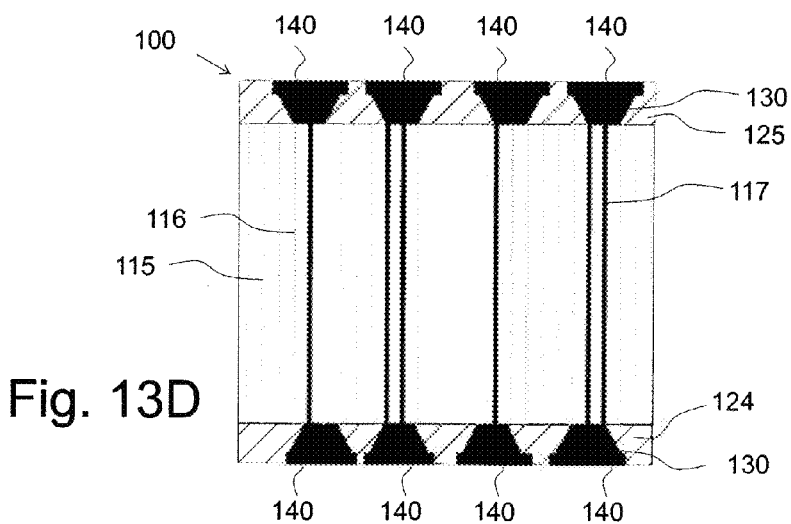
FIG. 13D presents yet another example of four conductors of a conductive trace structure according to an embodiment of the invention.

FIG. 13D presents a cross profile of a conductive trace structure having a conductor 110 comprised of several conductive fibers that are substantially very narrow. The conductive fibers such as conductive textiles or nanotubes comprising metal or carbon strands, for example, can be equally located in an insulation material as a mat. In the FIG. 13D some of the conductive fibers 115 are not connected to the both of the micro vias 130, some of the conductive fibers 116 are connected only to another micro via 130 and only some of the conductive fibers 117 make the actual electrical connection between the wiring layers with aid of the micro vias 130. The micro vias 130 and lands 140 are on both sides of the conductive trace structure 100 connected to the first (150) and second (160) wiring layers (not shown in FIGS. 13). The micro vias 130 and lands 140 are made in dielectric material 124 and 125 which can be for example non conductive paste, prepreg, resin or similar insulating material.

Figure 14:
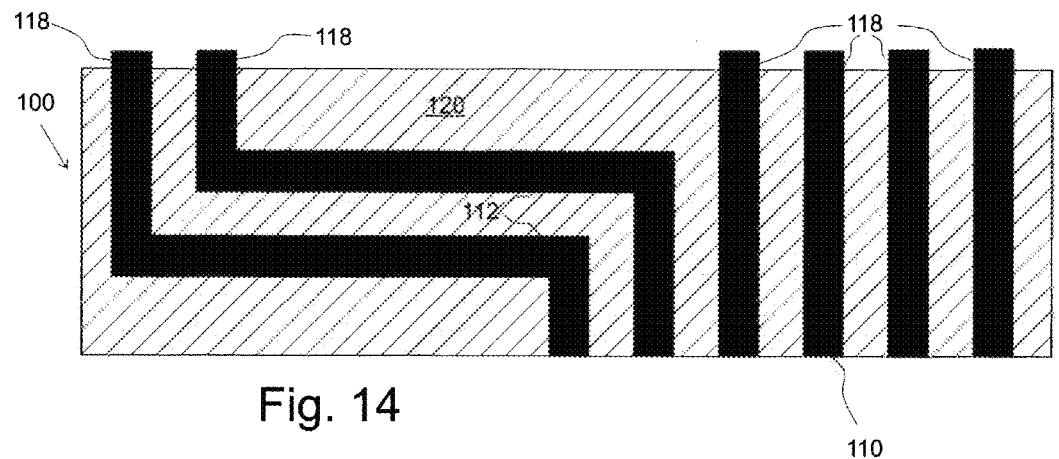
FIG. 14 presents a side view of a tenth conductive trace structure according to an embodiment of the invention.

FIG. 14 presents a side view of a conductive trace structure where some of the conductors such as 112 have curves or angles. Also some conductors such as 118 may also go on two different surfaces of the conductive trace structure 100.

Figure 15:
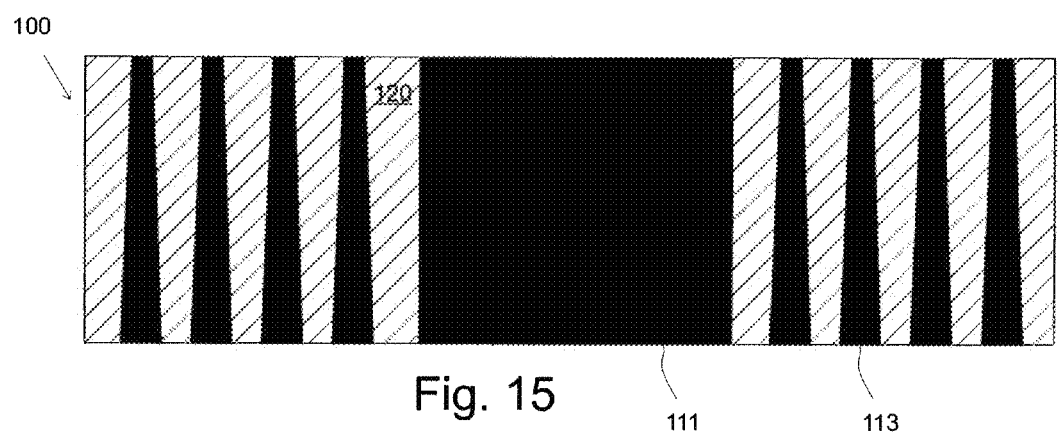
FIG. 15 presents a side view of a eleventh conductive trace structure according to an embodiment of the invention.

FIG. 15 presents a side view of a conductive trace structure having conductors 113 that are shaped as trapezoid. This is useful for instance applications where the first wiring layer (i.e. the layer to which the component's 10 contact pads are faced to) has contact pads in densely. In the middle there is presented a ground point 111.

Figure 16:
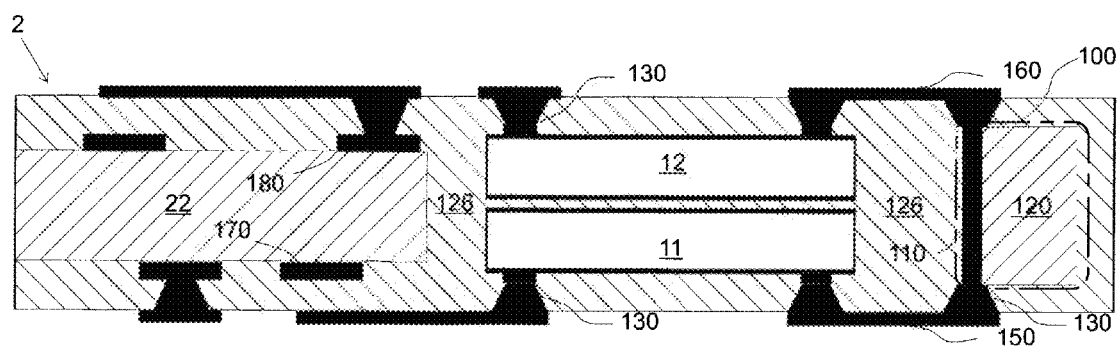
FIG. 16 presents a cross profile of an electronic module including a conductive trace structure according to an embodiment of the invention.

FIG. 16 presents a cross profile of an electronic module 2 according to an embodiment of the invention. The electronic module 2 is a multi-layer printed circuit board. The inner wiring layers 170 and 180 are supported by a substrate 22. In the electronic module there are embedded two components 11, 12 that are electrically connected to each other. The components 11 and 12 are embedded in a substrate 126. The substrates 126 and 22 can be the same material but they are manufactured at different times. Also a conductive trace structure 100 is embedded in the electronic module 2. In this example the conductive trace structure 100 is electrically connected to outer wiring layers 150 and 160. Naturally the conductive trace structure 100 can be connected in multi-layer applications from any layer to another any layer. Also the conductive trace structure 100 may be embedded at any place inside an electronic module 2.

The first component 11 is connected by micro vias 130 to the first wiring layer 150. The first component 11 is electrically connected by at least two vertical conductors 110 to the second component 12. The vertical conductors 110 are supported by a dielectric material 120 that differs from the surrounding dielectric material 126 of the printed wiring board. The ends of the vertical connectors 110 are connected to the first wiring layer 150 and second wiring layer 160 respectively by micro vias 130. Preferably all the electrical connections are made metallurgically and solderlessly.

Figure 17:
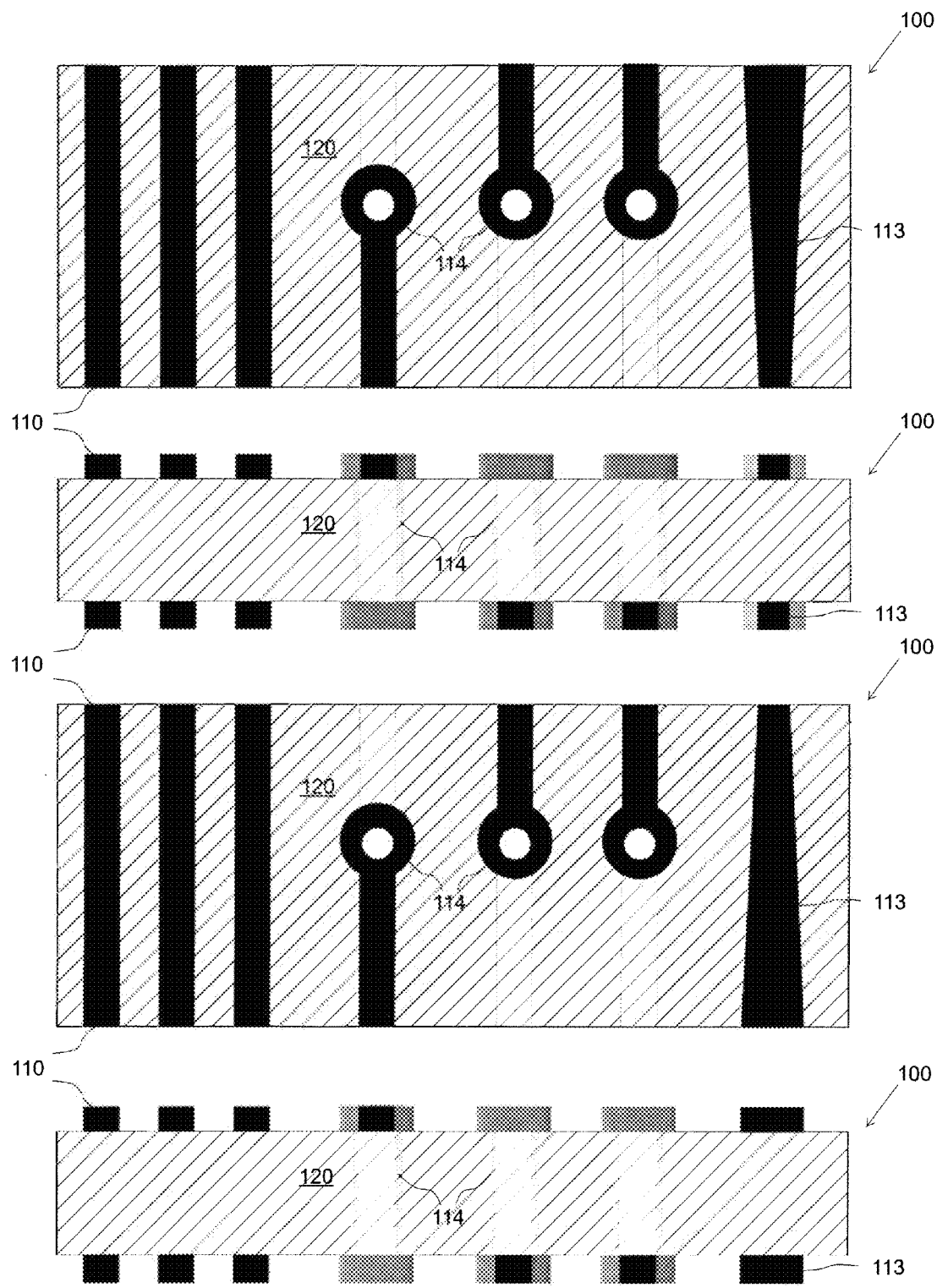
FIG. 17 presents four side views of a twelfth conductive trace structure according to an embodiment of the invention.

FIG. 17 presents four side profiles rotated round of a conductive trace structure. The conductive trace structure 100 contains three through holes 114. This example gives more design possibilities for routing, for example.

Figure 18A:
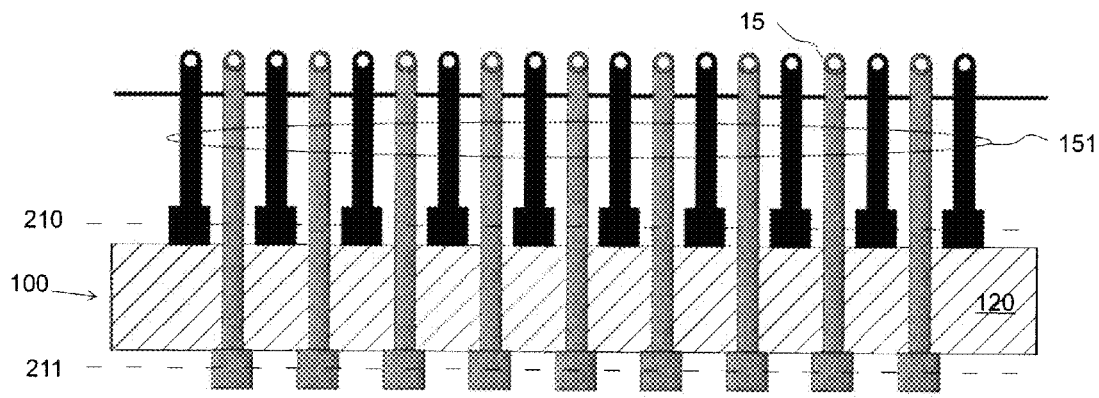
FIG. 18A presents a top view of a thirteenth conductive trace structure according to an embodiment of the invention.
Figure 18B:
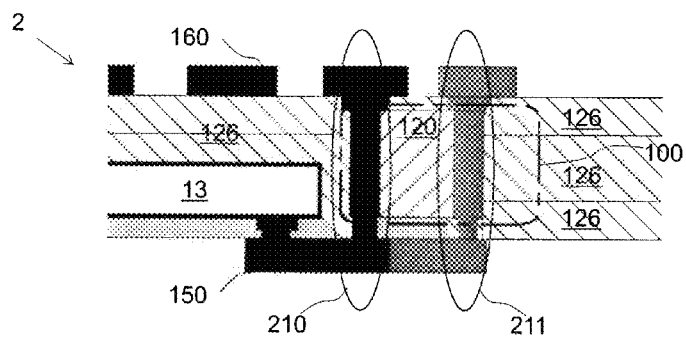
FIG. 18B presents a cross profile of the thirteenth conductive trace structure according to an embodiment of the invention.

FIGS. 18A and 18B present a view from the first wiring layer sight and a cross profile of a conductive trace structure 100 embedded in an electronic module 2 respectively. From the cross profile it can be seen how the conductors are placed and connected in a two row, 210 and 211, conductive trace structure 100. The component 13 is faced towards the first wiring layer 150. The conductors 151 lead from the component's contact pads 15 to the conductive trace structure's 100 conductors in rows 210 and 211. The conductive trace structure 100 is placed inside the main substrate 126. The conductors are directed to the second wiring layer 160 with the aid of the two-row conductive trace structure 100.

Figures 19A, 19B, 19C, 19D:
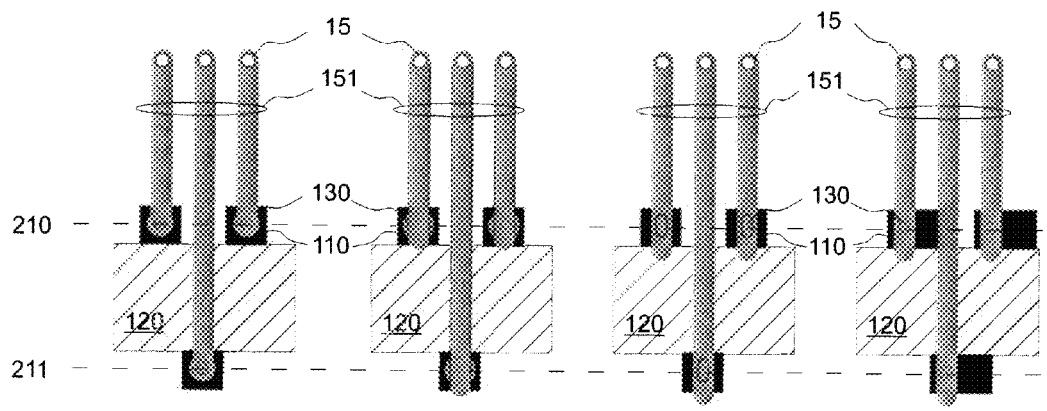
FIG. 19A presents a normal micro via connected to a conductor of a conductive trace structure according to an embodiment of the invention.
FIG. 19B presents a landless micro via connected to a conductor of a conductive trace structure according to an embodiment of the invention.
FIG. 19C presents an extended micro via connected to a conductor of a conductive trace structure according to an embodiment of the invention.
FIG. 19D presents a normal micro via connected to a conductor having large contact pads of a conductive trace structure according to an embodiment of the invention.

FIG. 19A presents a normal micro via 130 connected to a conductor 110 of a conductive trace structure.

FIG. 19B presents a landless micro via 130 connected to a conductor 110 of a conductive trace structure.

FIG. 19C presents an extended micro via 130 connected to a conductor 110 of a conductive trace structure.

FIG. 19D presents a normal micro via 130 connected to a conductor 110 having large pads of a conductive trace structure. This kind of solution allows tolerance in alignment and is therefore suitable for instance to the second wiring layer 160. In all FIGS. 19, the conductors 110 of a conductive trace structure are in two rows 210 and 211. Further in all FIGS. 19, the conductors 110 of a conductive trace structure, insulating material 120 supporting the conductors 110 of the conductive trace structure, conductors 151 between the conductors 110 of the conductive trace structure and the component on first wiring layer 150 and contact pads 15 of the component are presented.

FIGS. 20A-M and 21A-M present two different methods of manufacturing an electronic module having inside a conductive trace structure according to an embodiment of the invention. These methods and structures (and at least some parts of them) are mainly described in the U.S. Pat. Nos. 6,991,966; 7,294,529; 7,299,546; 7,609,527; 7,663,215; 7,673,387; 7,696,005 and in the U.S. patent applications Ser. Nos. 11/797,609; 11/878,557; 12/603,324; 11/570,673; 11/667,429; 11/791,547; 11/587,586; 11/917,724; 11/917,711; 11/917,737; 12/293,412; 12/506,519; 12/420,617 and U.S. Ser. No. 12/546,454 which are incorporated herein by reference.

Figure 20A:
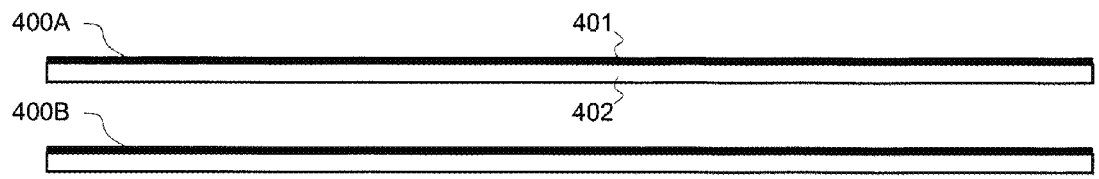
FIGS. 20A-20M present a first method for manufacturing an electronic module according to an embodiment of the invention.

FIG. 20A presents a phase of a first method. The method starts with taking a planar conductive layer, for example a copper foil 401. The copper foil 401 can be supported by a separate supporting layer 402 for easier and reliable handling during the manufacture. Alternatively at this phase, on top of the copper foil 401 there can also be an insulator layer 128 (not shown in this figure, see FIG. 21M) which will remain in the readymade electronic module 2 at the end. By using an insulator layer shorts between the copper foil 401 and the contact pads 15 of a component 13 as well as voids comprised by the process of applying non conductive paste can be minimized. There are two planar conductive layers presented namely 400A for the first wiring layer and 400B for the second wiring layer.

Figure 20B:

FIG. 20B presents that holes 404 for contact pads of a component and conductors of a conductive trace structure are made through the copper foil. This can be done by a UV drilling means, for example. Alternatively after this phase, on top of the hole made copper foils 401 can be laminated by an entire extending insulator layer 128 (not shown in this figure, see FIG. 21M).

Figure 20C:

FIG. 20C presents that non conductive paste 406 is applied in a desired place on the copper foil. In a preferred embodiment the non conductive paste imprints are designed to be located separately for each component 13 and conductive trace structure 100 in order to control the shape, volume and spreading of the each imprint.

Figure 20D:
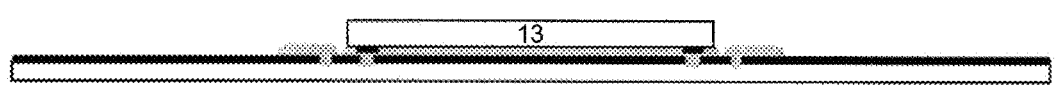

FIG. 20D presents that a component 13 is attached on the copper foil.

Figure 20E:
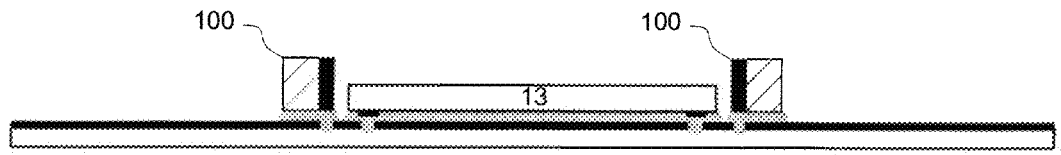

FIG. 20E presents that a conductive trace structure 100 is attached on the copper foil. Both the component 13 and conductive trace structures 100 are aligned precisely by the positions of conductor pads and before made holes or marks on the conductive layer.

Figure 20F:
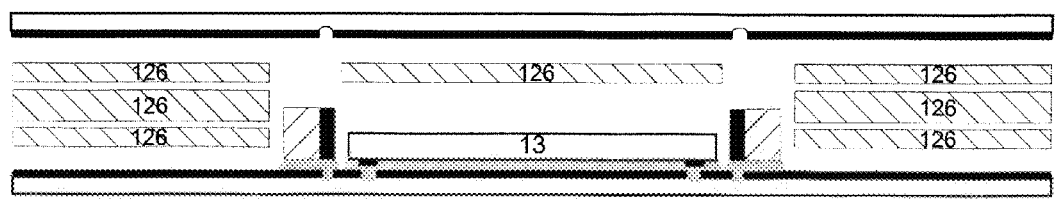
Figure 20G:
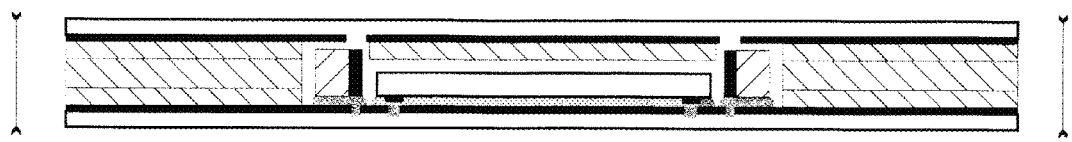

FIG. 20F (as well as in FIG. 20G) presents that a dielectric layer or layers 126 are prepared to an order and the basic construction of an electronic module is made ready for pressing.

Figure 20H:
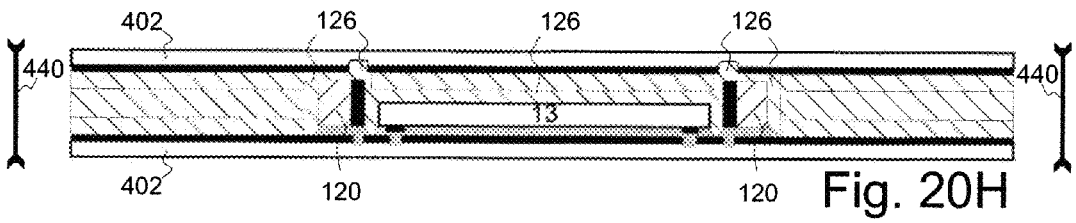

FIG. 20H presents that the readymade construction of an electronic module is pressed 440. The dielectric material 126 runs out to every place inside the electronic module where there is free space.

Figure 20I:
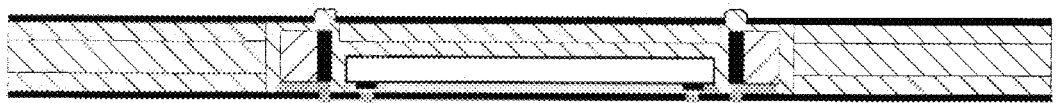

FIG. 20I presents that the optional supporting layer 402 is peeled off from the copper foil.

Figure 20J:
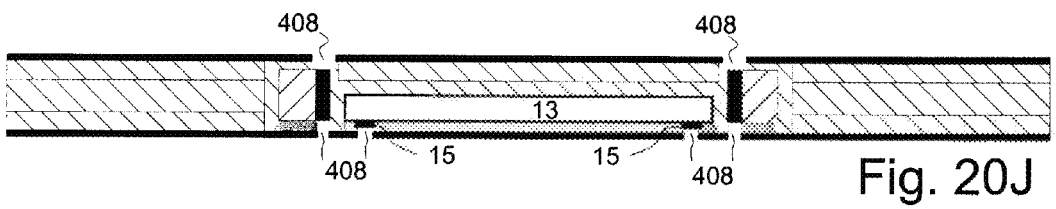

FIG. 20J presents that both surfaces of an electronic module are cleaned, for example by a CO2 laser. All the dielectric material 126, non conductive paste 406 and insulator layer (FIG. 21M, if used) will be removed that is influenced by the laser beam and only conductive surfaces will remain at the end. This guarantees also that all the contact pads 15 of the component 13 and conductors 110 of the conductive trace structure 100 will be open 408 for making the electrical connections.

Figure 20K:
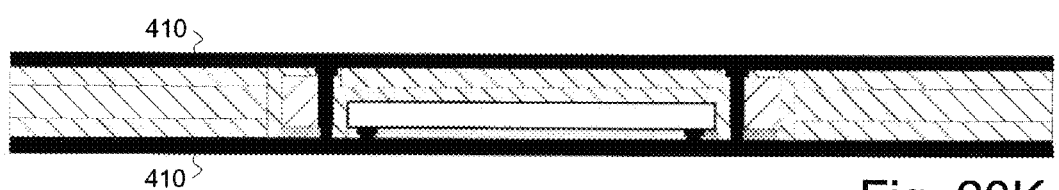

FIG. 20K presents that both surfaces of an electronic module are plated with conductive material 410.

Figure 20L:
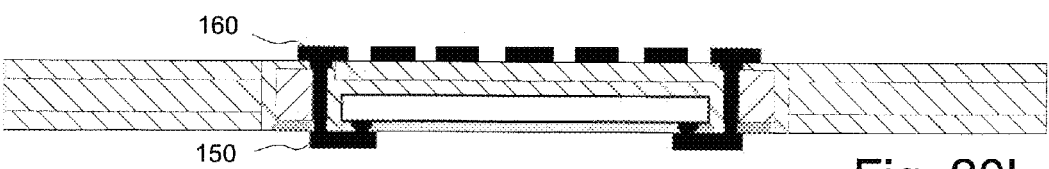

FIG. 20L presents that the desired conductive pattern is transferred and the first wiring layer 150 will be formed at the component's 13 face side and the second wiring layer 160 at the component's 13 rear side.

Figure 20M:
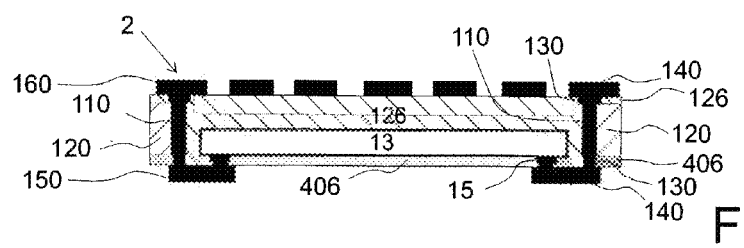

FIG. 20M presents that the electronic module 2 is diced from the panel. From this figure there can be seen the following parts of an electronic module 2 according to the product of the method according to an embodiment: Component 13 and its contact pads 15 which are connected to the first wiring layer 150 by micro vias 130. The component 13 and the conductive trace structures 100 are attached to the first wiring layer 150 by non conductive paste 406. The non conductive paste 406 comprises also a support layer 124 for the micro vias 130 at the side of the first wiring layer 150. The conductive trace structure comprises of conductors 110 and dielectric material 120. From the readymade electronic module there can be discovered that the dielectric material 120 differs from the dielectric material 126 used in other places of the electronic module 2. The conductors 110 lead to the second wiring layer 160 by micro vias 130 that are supported by an insulating material 126, that comprise the support layer 125.

FIGS. 21A-21L (-21M) presents the phases of a second method of manufacturing an electronics module in accordance with the present invention.

Figure 21A:
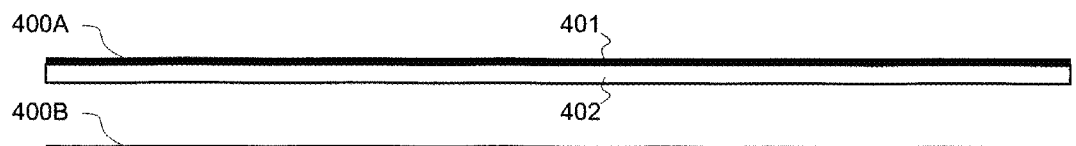
FIGS. 21A-21M present a second method for manufacturing an electronic module according to an embodiment of the invention.

FIG. 21A presents a phase of the second method. The method starts with taking two planar conductive layers 400A and 400B, for example copper foils 401 similar to the first method. The copper foils can be supported by a separate supporting layer 402 for easier and reliable handling during the manufacture. Alternatively at this phase, on top of the copper foil 401 there can also be an insulator layer 128 (not shown in this figure, see FIG. 21M) which will remain in the readymade electronic module 2 at the end. By using an insulator layer 128 shorts between the copper foil 401 and the contact pads 15 of a component 13 as well as voids comprised by the process of applying non conductive paste can be minimized.

Figure 21B:
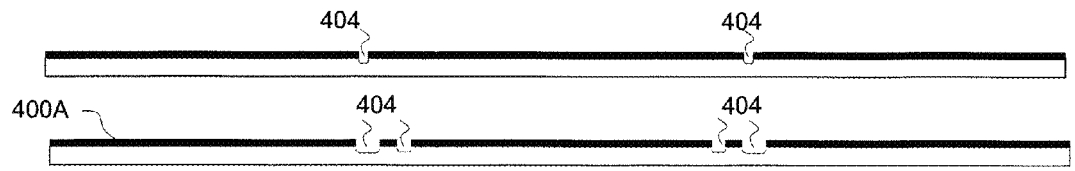

FIG. 21B presents that holes 404 for contact pads of a component are made through the copper foil to the other copper foil and holes for conductors of a conductive trace structure are made through the copper foil to the other copper foil. This can be done by a UV drilling means, for instance. Alternatively after this phase, on top of the hole made copper foils 401 can be laminated by an entire extending insulator layer 128 (not shown in this figure, see FIG. 21M).

Figure 21C:
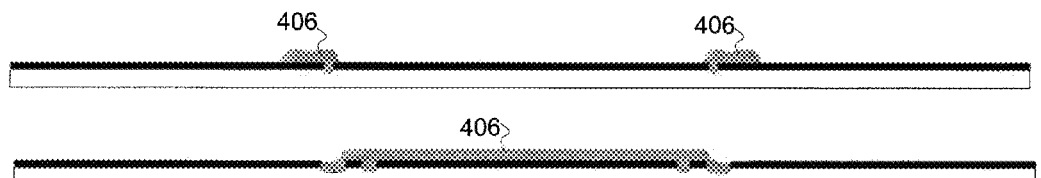

FIG. 21C presents that non conductive paste 406 is applied in a desired place on the copper foils.

Figure 21D:
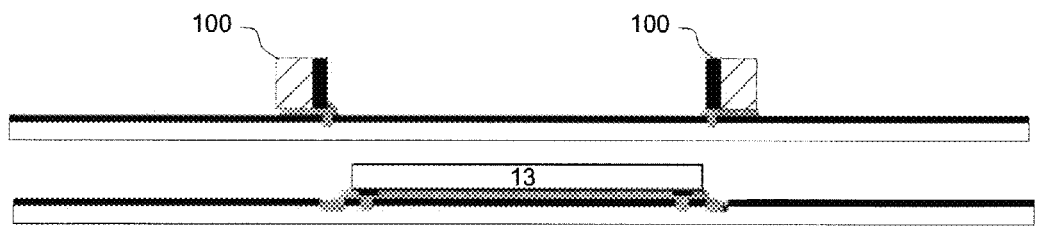

FIG. 21D presents that a component 13 is attached on the first copper foil 400A and two conductive trace structures 100 are attached on the second copper foil 400B. The second foil 400B is flipped and the foils are aligned together. Both the components 13 and conductive trace structures 100 are aligned precisely by the positions of conductor pads and before made holes or marks on the conductive layer.

Figure 21E:
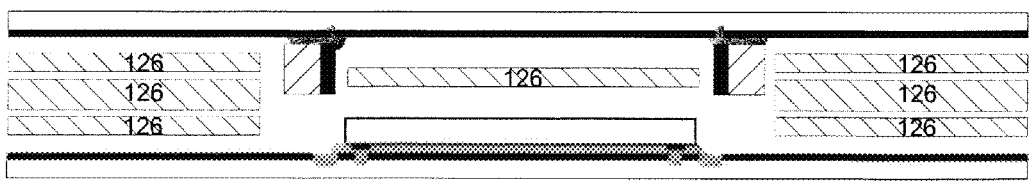
Figure 21F:
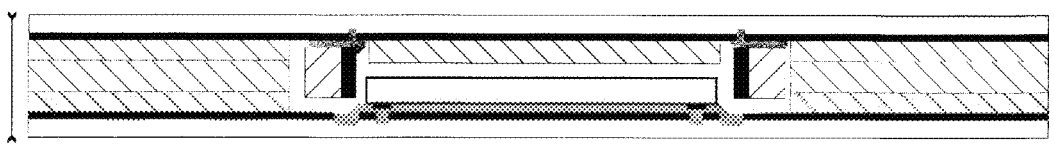

FIG. 21E as well as FIG. 21F present that a dielectric layer or layers 126 are prepared to an order, and the basic construction of an electronic module is made ready for pressing.

Figure 21G:
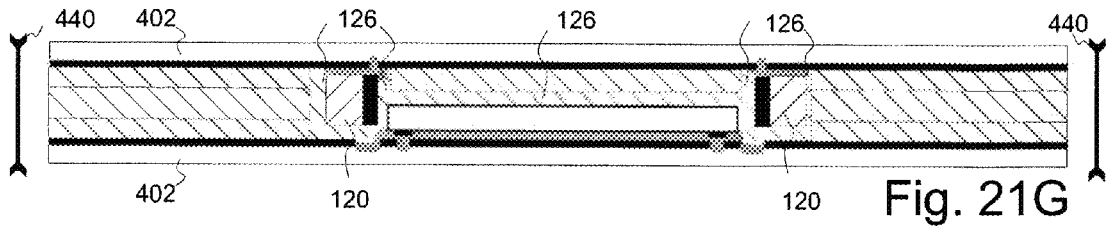

FIG. 21G presents that the readymade construction of an electronic module is pressed 440. The dielectric material 126 runs out to every place inside the electronic module where there is free space.

Figure 21H:

FIG. 21H presents that the optional supporting layer 402 is peeled off from the copper foil.

Figure 21I:
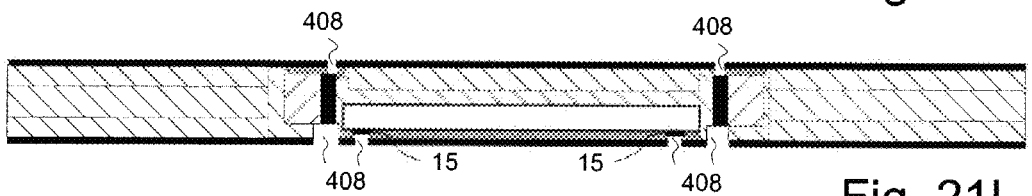

FIG. 21I presents that both surfaces of an electronic module are cleaned, for example, by a CO2 laser. All the dielectric material 126, non conductive paste 406 and insulator layer 128 (FIG. 21M, if used) will be removed that is in straight influence of the laser beam and only conductive surfaces will remain at the end. This guarantees also that all the contact pads 15 of the component 13 and conductors 110 of the conductive trace structure 100 will be open 408 for making the electrical connections.

Figure 21J:
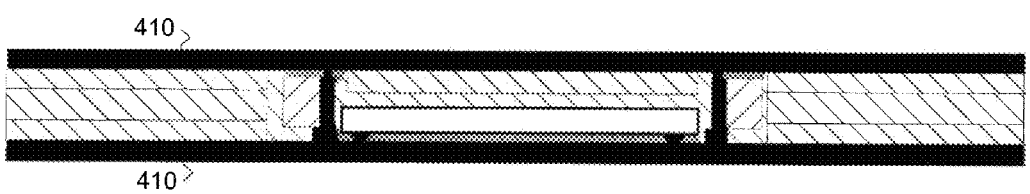

FIG. 21J presents that both surfaces of an electronic module are plated with conductive material 410.

Figure 21K:
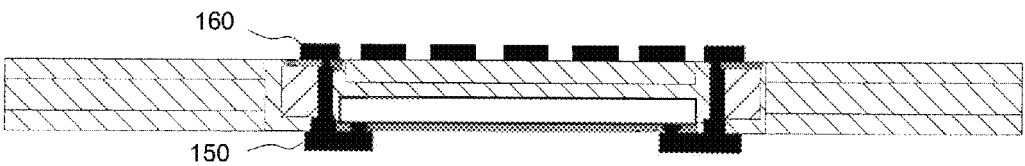

FIG. 21K presents that the desired conductive pattern is transferred and the first wiring layer 150 will be formed at the component's 13 face side and the second wiring layer 160 at the component's 13 rear side.

Figure 21L:
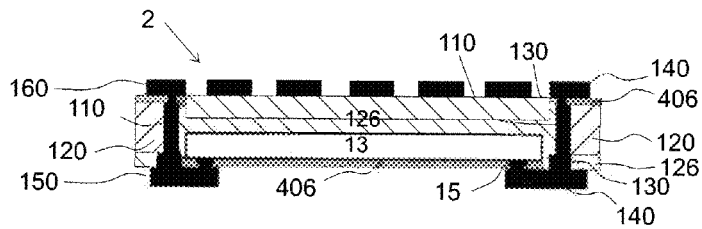

FIG. 21L presents that the electronic module 2 is diced from the panel. From this figure there can be seen the following parts of an electronic module 2 produced according to the present method of manufacture: Component 13 and its contact pads 15 which are connected to the first wiring layer 150 by micro vias 130. The micro vias 130 at the side of the first wiring layer 150 are supported by an insulating material 126 pressed in the phase 21G. The component 13 is attached to the first wiring layer 150 by non conductive paste 406. The conductive trace structures 100 are attached to the second wiring layer 160 by non conductive paste 406. The non conductive paste 406 comprises also a support layer 125 for the micro vias 130 at the side of the second wiring layer 150. The conductive trace structure comprises of conductors 110 and dielectric material 120. From the readymade electronic module there can be discovered that the dielectric material 120 differs from the dielectric material 126 used in other places of the electronic module 2. The conductors 110 lead to the second wiring layer 160 by micro vias 130 that are supported by non conductive paste 406, which forms also a support layer 124.

Figure 21M:
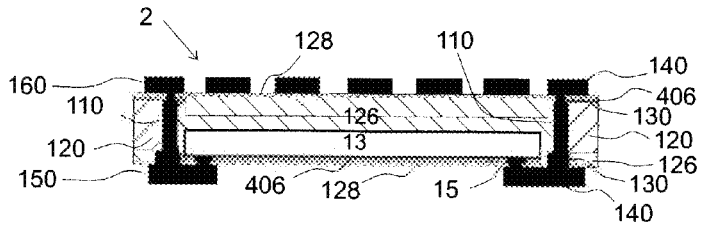

FIG. 21M presents that the electronic module 2 is diced from the panel same as in FIG. 21L. From this figure there can be seen also the insulator layer 128 of an electronic module 2 produced according to the alternative method of manufacture.

Figure 22:
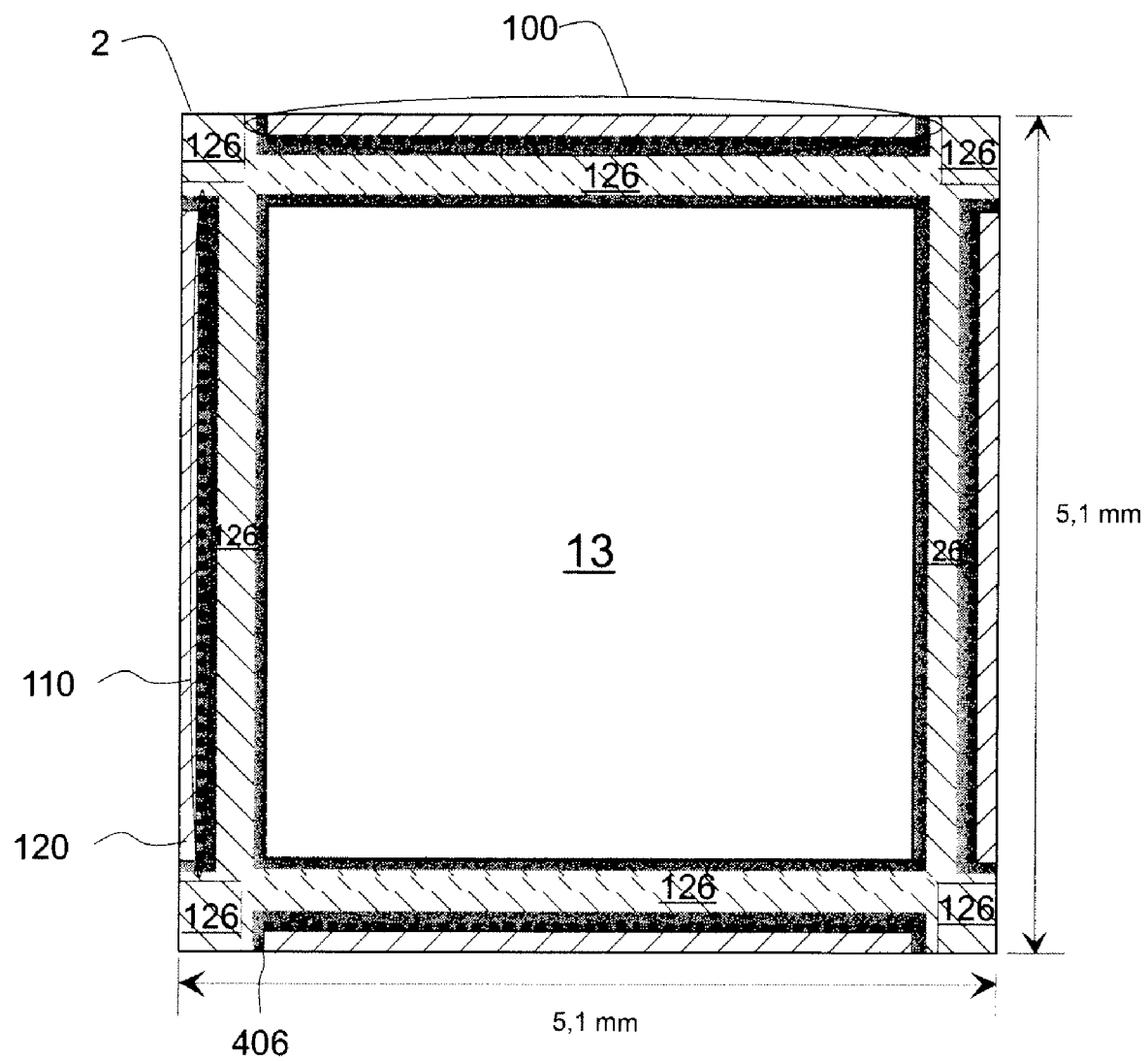
FIG. 22 presents an electronic module according to an embodiment of the invention manufactured by the first method.

FIG. 22 presents a top view of an electronic module. The electronic module 2 contains a component 13 which can be the same kind of component 10 (size 4 mm×4 mm) shown in FIG. 2. The electronic module 2 is manufactured by the method presented in FIGS. 20A-M with four conductive trace structures 100 on each of the four sides of the component 13. With the aid of the novel conductive trace structure 100, the total size of the electronic modules decreased by 42%, to 5.1 mm×5.1 mm, compared to the prior art electronics module in FIG. 2.

Figure 23:
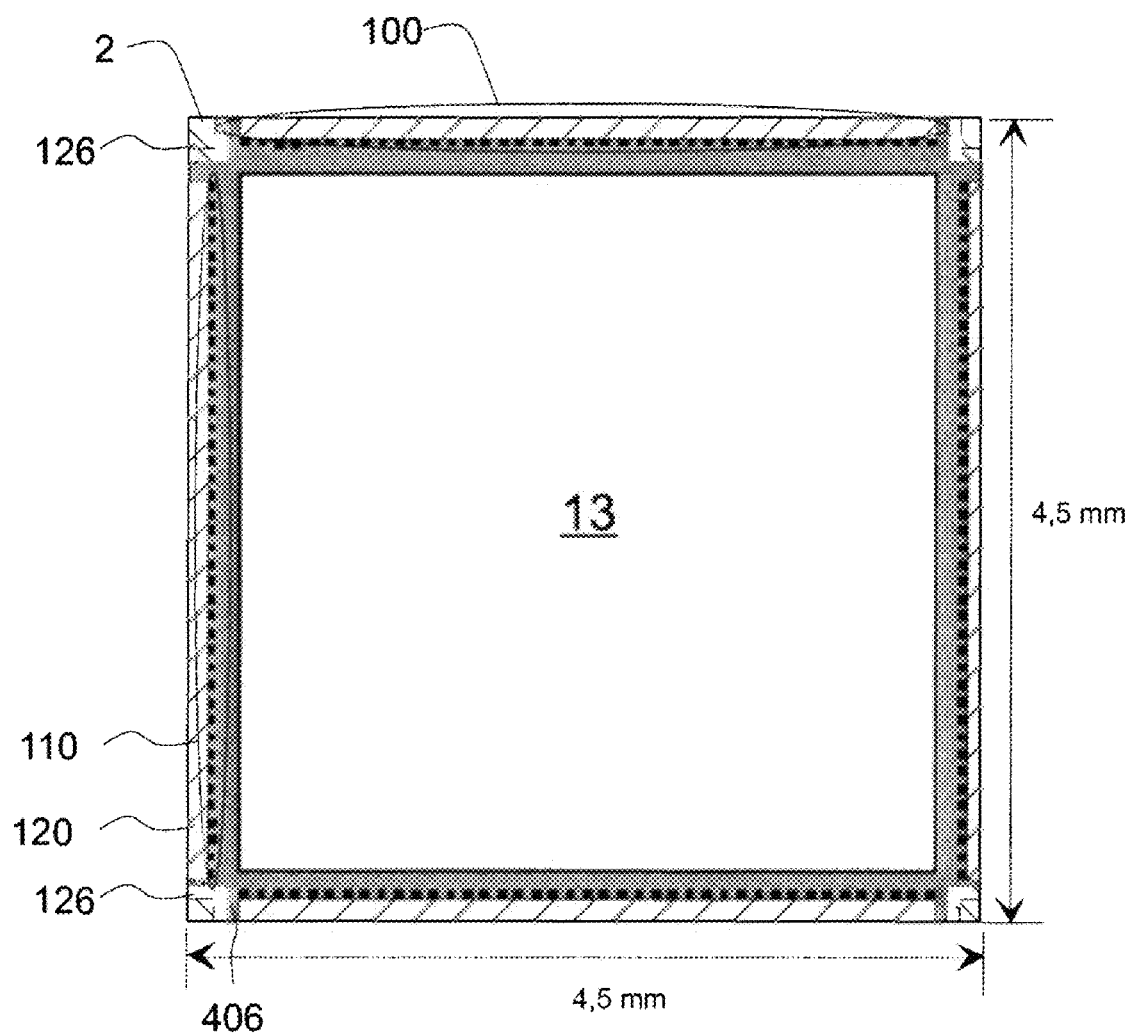
FIG. 23 presents an electronic module according to an embodiment of the invention manufactured by the second method.

FIG. 23 presents a top view of an electronic module. The electronic module 2 contains a component 13 which can be the same kind of component 10 (size 4 mm×4 mm) shown in FIG. 2. The electronic module 2 is manufactured by the method presented in FIGS. 21A-M with four conductive trace structures 100 on each of the four sides of the component 13. With the aid of the novel conductive trace structure the total size of the electronic modules decreased by 55%, to 4.5 mm×4.5 mm, compared to the prior art electronic module 1 in FIG. 2.

Figure 24:
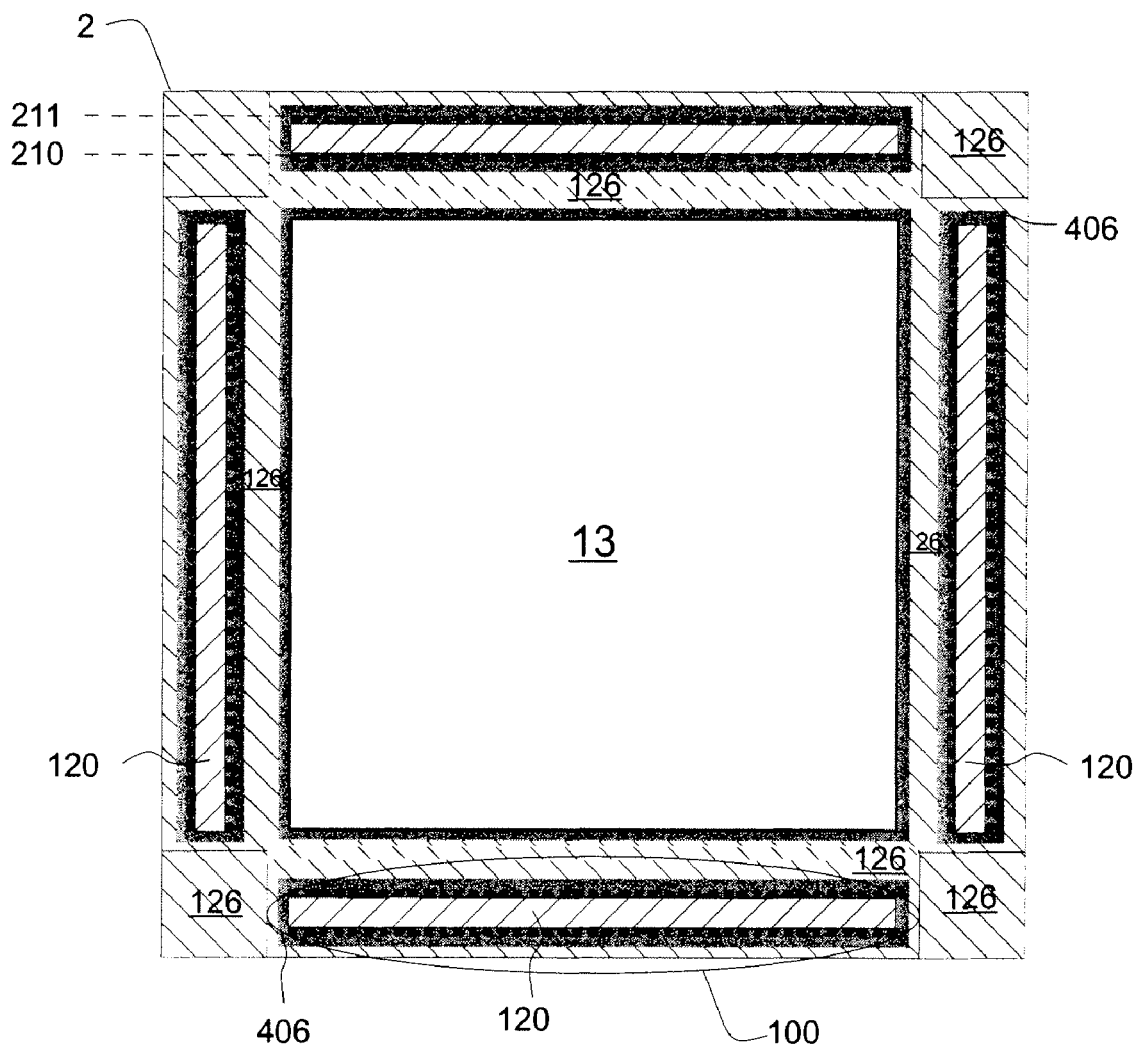
FIG. 24 presents another electronic module according to an embodiment of the invention manufactured by the first method.

FIG. 24 presents a top view of an electronic module. The electronic module 2 is manufactured by the method presented in FIGS. 20A-M. The electronic module 2 contains four, 2-conductive row, conductive trace structures 100 on each of the four sides of the component 13.

Figure 25:
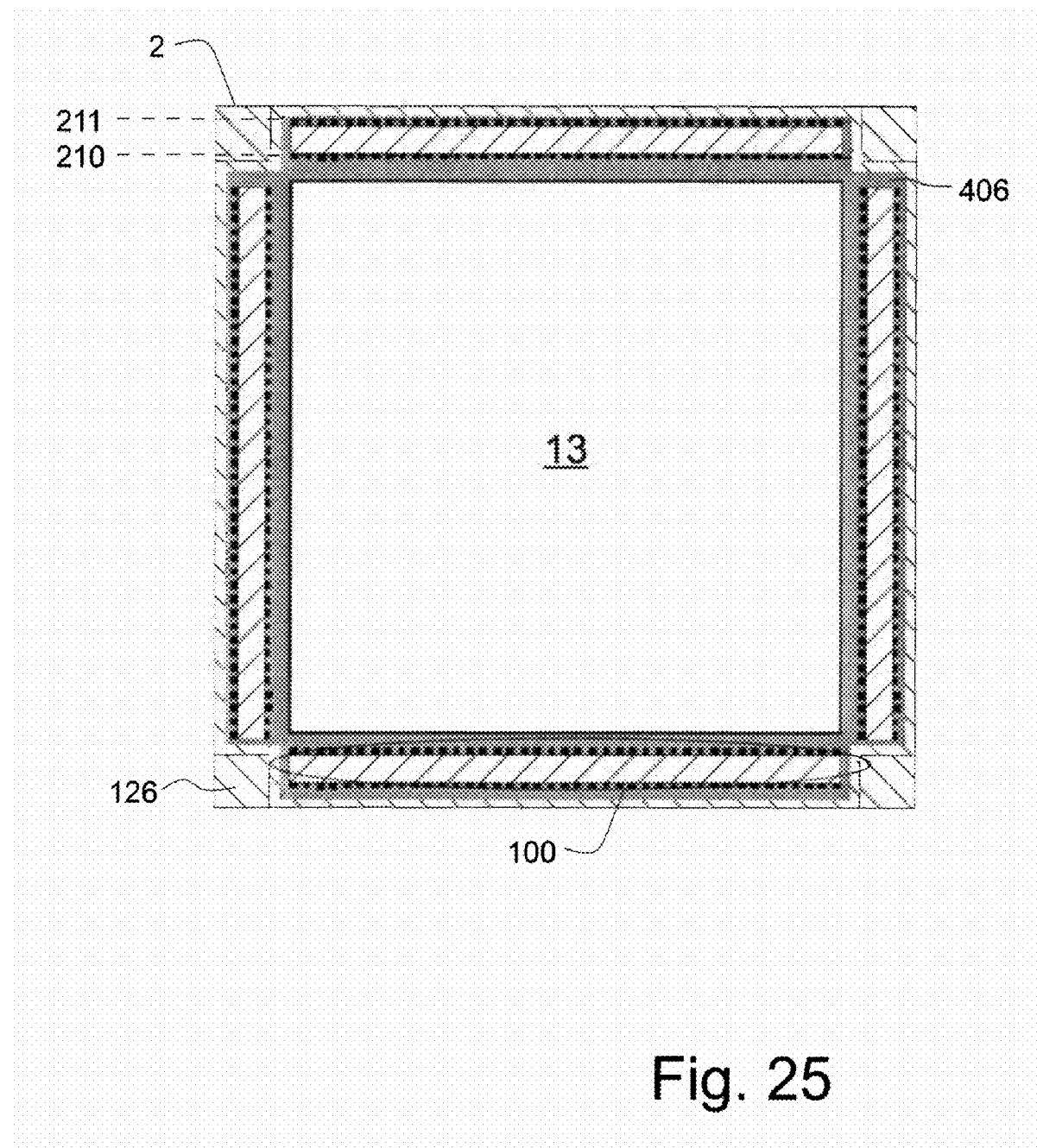
FIG. 25 presents another electronic module according to an embodiment of the invention manufactured by the second method.

FIG. 25 presents a top view of an electronic module. The electronic module 2 is manufactured by the method presented in FIGS. 21A-M. The electronic module 2 contains four, 2-conductive row, conductive trace structures 100 on each of the four sides of the component 13.

Figure 26:
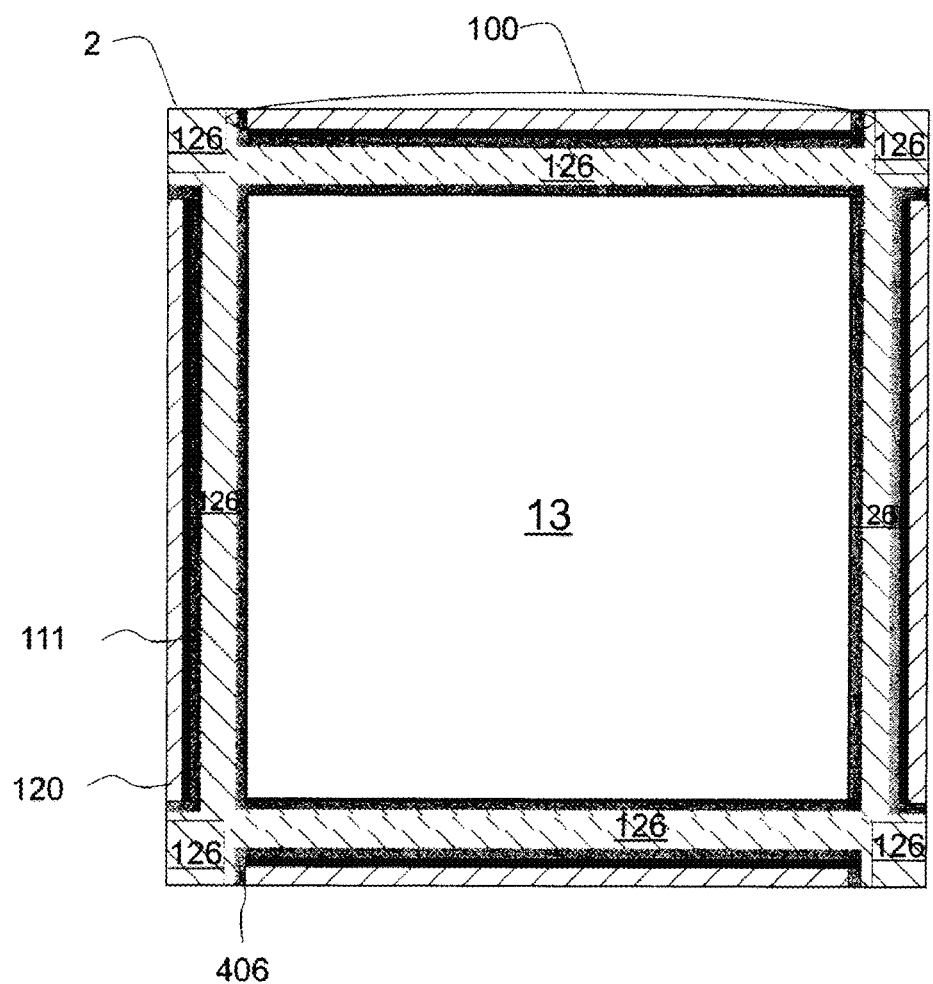
FIG. 26 presents yet another electronic module according to an embodiment of the invention manufactured by the first method.
Figure 26:
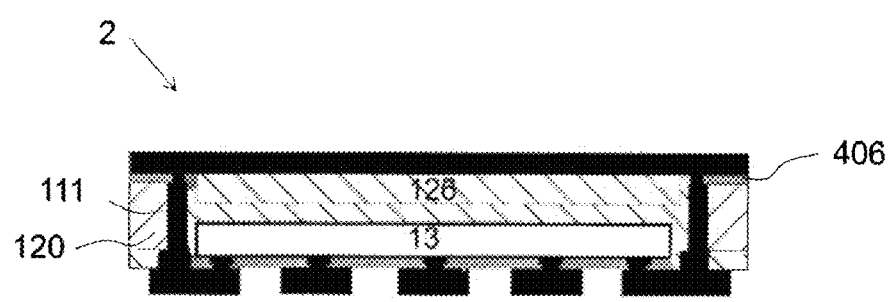

FIG. 26 presents a top view of an electronic module. The electronic module 2 is manufactured by the method presented in FIGS. 20A-M. The electronic module 2 contains four, conductive trace structures 100 on each of the four sides of the component 10. All of the conductive trace structures 100 have an EMI shielding function 111.

The above description is only to exemplify the invention and is not intended to limit the scope of protection offered by the claims. One of ordinary skill in the art will recognize other materials, conductive patterns, designs and techniques for implementing the methods and apparatus disclosed herein without deviating from the scope of the invention.

LIST OF REFERENCE NUMERALS

Prior Art Reference Numerals
1 Electronic module.
10 Component having tens or hundreds of pads.
21 Substrate, dielectric composite e.g. FR4, PI or similar
40 Footprint area needed for a component 10.
42 Restricted area where through holes and laser pads are not allowed to place.

44 Plated through hole (PTH)
46 Laser pad
47 Land of a PTH
48 Hole of a PTH
49 Conductive material in PTH's hole
Present Invention Reference Numerals
2 Electronic module with a conductive trace structure.
11 Component having tens or hundreds of pads faced to the first wiring layer 150.
12 Component having tens or hundreds of pads faced to the second wiring layer 160.
13 A Component having tens or hundreds of pads facing a wiring layer
15 Contact pad of a component.
22 Inner layer substrate of a multilayer electronic module
100 Conductive trace structure according to an embodiment of the invention.
102 Gap, empty space between the two conductors 110 that are located on the same row.
110 Conductor of a conductive trace structure 100 according to an embodiment of the invention.
111 Ground, EMI shield or similar functional conductor of a conductive trace structure 100 according to an embodiment of the invention.
112 An example of a functional conductor (angle conductor) of a conductive trace structure 100 according to an embodiment of the invention.
113 Another example of a functional conductor (trapezoid conductor) of a conductive trace structure 100 according to an embodiment of the invention.
114 Another example of a functional conductor (through hole conductor) of a conductive trace structure 100 according to an embodiment of the invention.
115 Another example of a functional conductor (not connected from both ends) of a conductive trace structure 100 according to an embodiment of the invention.
116 Another example of a functional conductor (connected only from other end) of a conductive trace structure 100 according to an embodiment of the invention.
117 Another example of a functional conductor (connected from both ends) of a conductive trace structure 100 according to an embodiment of the invention.
118 Another example of a functional conductor (conductor going on at least on two different surfaces) of a conductive trace structure 100 according to an embodiment of the invention.
120 Substrate, dielectric composite that supports the conductors 110 according to an embodiment of the invention.
121 First dielectric layer of a conductive trace structure 100 according to an embodiment of the invention.
122 Second dielectric layer of a conductive trace structure 100 according to an embodiment of the invention.
123 Third dielectric layer of a conductive trace structure 100 according to an embodiment of the invention.
124 Insulation layer located between a conductive trace structure 100 and first wiring layer 150. Insulation layer 124 can be for instance resin, prepreg, non conductive paste or similar.
125 Insulation layer located between a conductive trace structure 100 and second wiring layer 160. Insulation layer 125 can be for instance resin, prepreg, non conductive paste or similar.
126 Substrate, dielectric composite e.g. FR4, PI or similar
128 Insulator layer.
130 Microvia.
140 Land.
150 First wiring layer.
151 Conductor between a contact pad 15 of a component 10 and a conductor 110 of a conductive trace structure 100.
160 Second wiring layer.
170 Another wiring layer in multi-layer electronic module where a conductive trace structure is straight connected.
180 Another wiring layer in multi-layer electronic module where a conductive trace structure is straight connected.
210 Conductor row in a conductive trace structure 100 according to an embodiment of the invention.
211 Conductor row in a conductive trace structure 100 according to an embodiment of the invention.
212 Conductor row in a conductive trace structure 100 according to an embodiment of the invention.
213 Conductor row in a conductive trace structure 100 according to an embodiment of the invention.
400A and 400B planar conductive layers.
401 Copper (Cu) foil.
402 Support membrane, supporting layer.
404 Laser drilled hole through the copper foil 401.
406 Non conductive paste.
408 Laser cleaned surface (hole).
410 Plating layer.
440 Pressing.

The invention claimed is:

1. An electronic module, comprising:
a dielectric substrate having a first surface and a second surface;
a first wiring layer on the first surface of the dielectric substrate;
a second wiring layer on the second surface of the dielectric substrate;
a semiconductor component inside the dielectric substrate and comprising at least two contact pads facing the first wiring layer;
first microvias electrically connecting the at least two contact pads to the first wiring layer; and
at least one conductive trace structure at least partly inside the dielectric substrate, the conductive trace structure comprising:
at least one conductive trace electrically connected to the first wiring layer and the second wiring layer; and
a piece of dielectric supporting said at least one conductive trace.

2. The electronic module of claim 1, wherein the at least one conductive trace is electrically connected to the first wiring layer via at least one second microvia and to the second wiring layer via at least one third microvia.

3. The electronic module of claim 2, wherein
said at least one second microvia comprises at least two second microvias;
said at least one third microvia comprises at least two third microvias; and
said at least one conductive trace comprises at least two conductive traces electrically connecting the respective ones of the at least two second microvias with the respective ones of the at least two third microvias.

4. The electronic module of claim 2, wherein the at least one conductive trace comprises at least one metal line fabricated on the piece of dielectric supporting said at least one conductive trace.

5. The electronic module of claim 4, wherein the at least one metal line has a length from the respective second microvia to the respective third microvia and a series of line widths in a direction perpendicular to said length, at least one of the line widths being less than the length.

6. The electronic module of claim 5, wherein the at least one metal line has a thickness in a direction perpendicular to said length and widths, the thickness being less than the length.

7. The electronic module of claim 5, wherein the at least one metal line has a first end and a second end, and the line width at the first end is less than the line width at the second end.

8. The electronic module of claim 1, wherein the at least one conductive trace comprises:
   at least one first conductive trace fabricated on a first surface of the piece of dielectric; and
   at least one second conductive trace fabricated on a second surface of the piece of dielectric.

9. The electronic module of claim 8, wherein the at least one conductive trace structure comprises at least one via extending through the piece of dielectric and electrically connecting at least one first conductive trace on the first surface to at least one second conductive trace on the second surface.

10. The electronic module of claim 1, wherein the at least one conductive trace comprises at least one piece of metal wire.

11. The electronic module of claim 1, wherein the at least one conductive trace comprises at least one metal plate fabricated on the piece of dielectric supporting said at least one conductive trace.

12. The electronic module of claim 2, wherein each of the first, second and third microvias comprises at least one layer of metal.

13. The electronic module of claim 2, wherein each of the first, second and third microvias comprises at least one first layer of electrolessly plated metal and at least one second layer of electroplated metal on said at least one first layer.

14. The electronic module of claim 1, wherein the at least one conductive trace structure is a piece of a circuit board.

15. The electronic module of claim 1, wherein
   the dielectric substrate includes first reinforcing fibers extending along a first plane; and
   the piece of dielectric in the conductive trace structure includes second reinforcing fibers extending in a direction perpendicular to the first plane.

16. The electronic module of claim 1, wherein the volume of the conductive trace structure is less than 10% of the volume of the electronic module.

17. An electronic module comprising:
   at least one semiconductor device, wherein at least a portion of the at least one semiconductor device is embedded in a first substrate and electrically connected to a first wiring layer supported by the first substrate,
   at least one second wiring layer separated from the semiconductor device by at least a portion of the first substrate, and
   at least one conductive trace structure, at least partially encased in the first substrate, and electrically connecting the at least one semiconductor device to the at least one second wiring layer, wherein the electrical connection is achieved by a plurality of solid conductors extending from the at least one semiconductor device, the first wiring layer and/or the connection between the semiconductor device to the first wiring layer to at least one second wiring layer, the plurality of solid conductors being at least partially encased in a second substrate forming the at least one conductive trace structure, the second substrate being of different composition from the first substrate.

18. An electronic module comprising a conductive trace structure at least partially encased in the substrate of the electronic module, the conductive trace structure comprising;
   at least one solid conductor extending at least the entire height of the conductive trace structure,
   at least one dielectric substrate in attachment with the at least one solid conductor, the at least one dielectric substrate being of different composition from the substrate encasing the conductive trace structure in the electronic module.

19. The electronic module according to claim 18, in which the conductive trace structure has a height less than the height of the electronic module substrate and is completely encased in the substrate of the electronic module with electrical connections connecting the at least one solid conductor to two distinct components of the electronic module.

20. The electronic module according to claim 18, in which the conductive trace structure comprises a plurality of individual solid conductors.

21. The electronic module according to claim 18, in which the at least one solid conductor is a metal plate extending at least a substantial portion of the width of the conductive trace structure and is capable of acting as a shield against electromagnetic interference.

* * * * *